US010012692B2

(12) United States Patent
Ross et al.

(10) Patent No.: US 10,012,692 B2
(45) Date of Patent: Jul. 3, 2018

(54) PRECISION PROBE POSITIONING FOR AT-SPEED INTEGRATED CIRCUIT TESTING USING THROUGH SILICON IN-CIRCUIT LOGIC ANALYSIS

(71) Applicants: Larry Ross, Los Gatos, CA (US); Michael Bruce, Austin, TX (US)

(72) Inventors: Larry Ross, Los Gatos, CA (US); Michael Bruce, Austin, TX (US)

(*) Notice: Subject to any disclaimer, the term of this patent is extended or adjusted under 35 U.S.C. 154(b) by 708 days.

(21) Appl. No.: 14/299,696

(22) Filed: Jun. 9, 2014

(65) Prior Publication Data
US 2015/0355274 A1 Dec. 10, 2015
US 2017/0299653 A9 Oct. 19, 2017

Related U.S. Application Data

(63) Continuation of application No. 13/862,244, filed on Apr. 12, 2013, now Pat. No. 9,714,978.

(60) Provisional application No. 61/623,442, filed on Apr. 12, 2012.

(51) Int. Cl.
G01R 31/311 (2006.01)
G01R 31/3177 (2006.01)

(52) U.S. Cl.
CPC ........ G01R 31/311 (2013.01); G01R 31/3177 (2013.01)

(58) Field of Classification Search
CPC ............ G01R 1/06705; G01R 1/07342; G01R 31/3177
USPC ....... 324/76.11, 96–98, 500, 754.01–754.21, 324/755.01, 755.11, 690, 696
See application file for complete search history.

(56) References Cited

U.S. PATENT DOCUMENTS

2008/0058629 A1* 3/2008 Seibel ................. A61B 1/0008
600/368
2010/0277159 A1* 11/2010 Ng ....................... G01R 31/311
324/97

* cited by examiner

Primary Examiner — Melissa Koval
Assistant Examiner — Trung Nguyen
(74) Attorney, Agent, or Firm — Ascenda Law Group, PC

(57) ABSTRACT

A method, system, and computer program product for precision probe positioning and testing of an integrated circuit. Methods, systems, and a computer program product implement techniques for determining a particular area of interest for precision probe positioning and testing where the particular area of interest comprises an area less than an entire area of the integrated circuit. Once the particular area of interest for testing has been determined, then a laser probe is steered or otherwise directed to illuminate a plurality of pixels within the area of interest so as to generate reflected signals corresponding to the illuminated pixels. Techniques are provided for measuring the reflected signals to determine information about the IC within the area of interest. CAD data or user data can be used to determine XY addressable pixel locations within the area of interest.

16 Claims, 27 Drawing Sheets

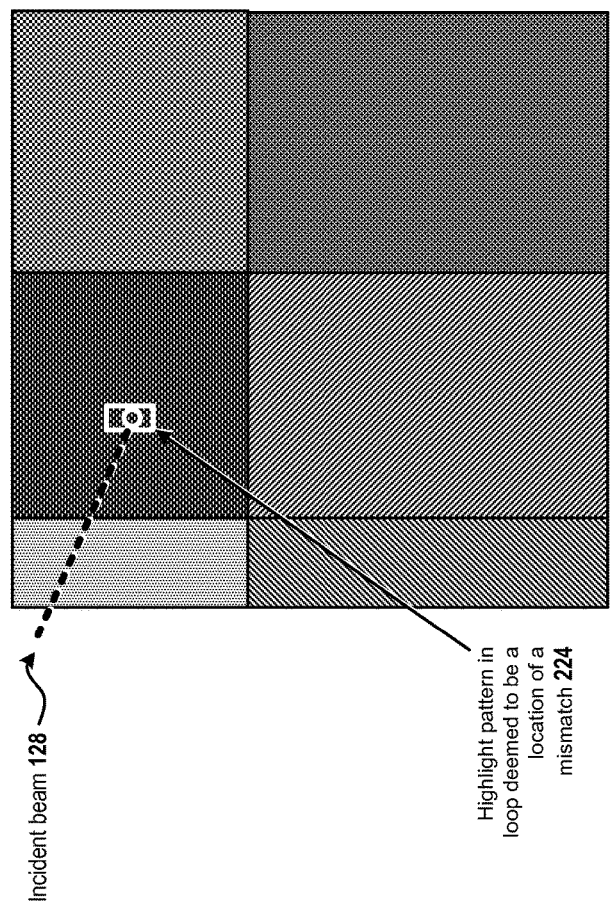

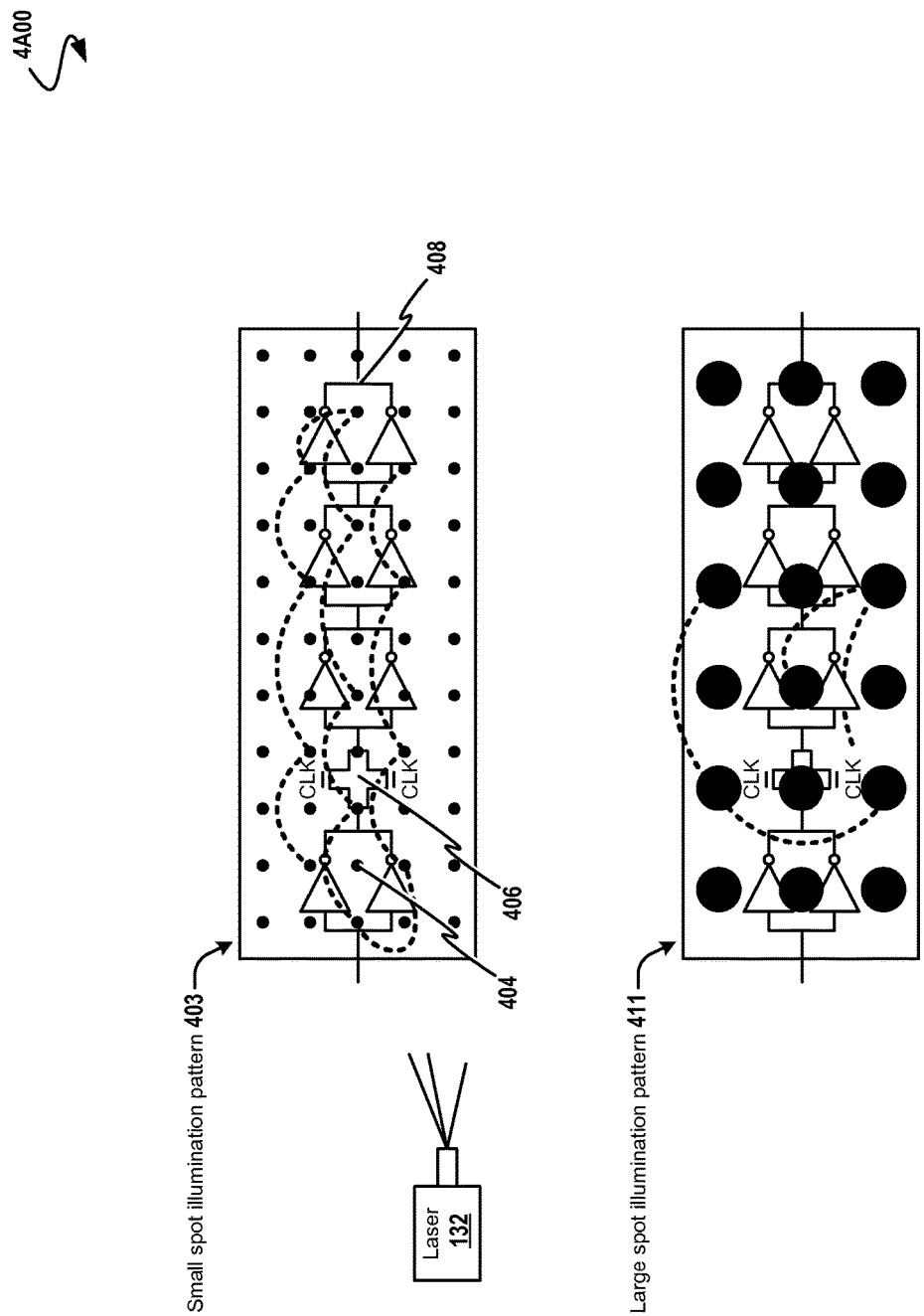

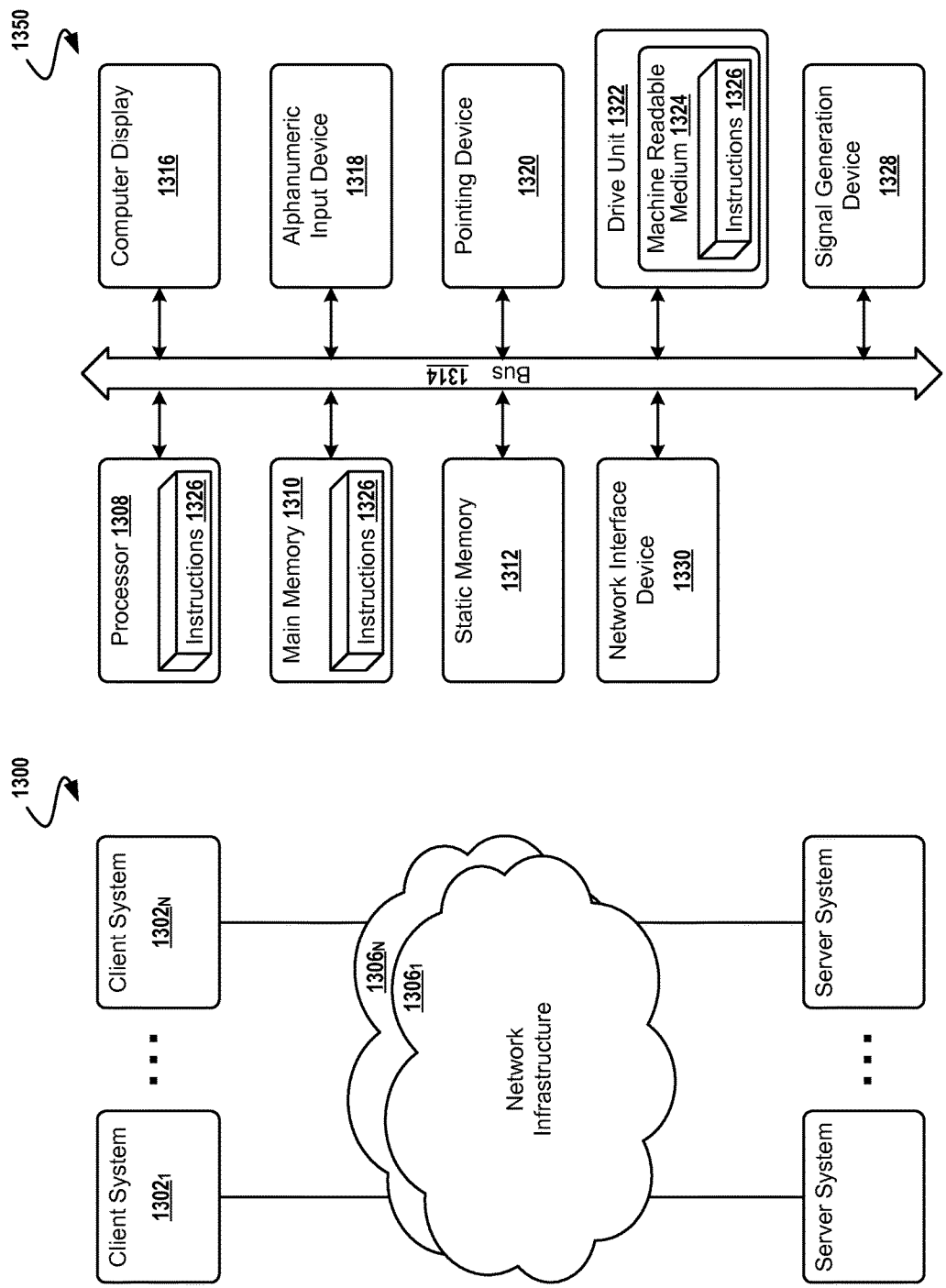

PRECISION PROBE POSITIONING FOR AT-SPEED INTEGRATED CIRCUIT TESTING USING THROUGH SILICON IN-CIRCUIT LOGIC ANALYSIS

RELATED APPLICATIONS

The present application is a Continuation of U.S. patent application Ser. No. 13/862,244, entitled "AT-SPEED INTEGRATED CIRCUIT TESTING USING THROUGH SILICON IN-CIRCUIT LOGIC ANALYSIS", filed Apr. 12, 2013 (now issued as U.S. Pat. No. 9,714,978), which claims the priority benefit of U.S. Provisional Patent Application Ser. No. 61/623,442 filed Apr. 12, 2012 entitled "THROUGH SILICON IN-CIRCUIT LOGIC ANALYSIS", both of which are hereby incorporated by reference in their entirety.

FIELD

The disclosure relates to the field of integrated circuit (IC) wafer and die testing and more particularly to precision probe positioning used for at-speed observation and analysis of sites of an IC for fast through-silicon in-circuit logic analysis.

BACKGROUND

The above-captioned patent references disclose laser-based through silicon in-circuit logic analysis as applied to integrated circuits (ICs) that contain up to billions of gates or transistors. Laser-based through silicon in-circuit logic analysis can be performed, even on such huge ICs, since direct access to the active regions is available through the backside. Various techniques have been developed to allow access through the backside to determine voltages, parametrics, logic states, and other information or electrical properties of the electronic devices. However, inasmuch as each probe takes a certain amount of time, when billions of gates or transistors are subjected to through-silicon analysis, the time-on-tester (ToT) can become quite large. The amount of time-on-tester grows superlinearly as the size of the IC increases, and/or as the number of gates or transistors grows, and/or as the number of probes used to read logic values increases.

However, when performing failure analysis, it is often the case that the cause or suspected cause of a failure can be isolated to a particular portion or particular areas of the IC, and only certain areas need to be probed. Probing only certain areas of an IC can lead to significant time-savings. However what is needed is a technique to probe only specific points on an IC, and perform analysis based on only the data read from the probe points or diagnostic reports.

Thus, in order to address the problem of inexorably increasing time-on-tester (e.g., as ICs become more and more complex), techniques are needed to probe specific areas of an IC. More specifically, what is needed is a technique for performing precision probe positioning to take readings, which readings are then subjected to any form or forms of analysis.

Probes and sensors of various types (e.g., laser probes, photon sensors, etc.) can be applied in order to read or create perturbations of one or more active regions. Such probes and sensors take advantage of certain properties of the silicon substrate; in particular, the property that certain electromagnetic radiation (e.g., infrared light) can pass through the substrate, such that a portion of the radiation is reflected back through the substrate. Some such techniques are briefly discussed below:

Light Induced Voltage Alteration:

Reading perturbations of one or more active regions is sometimes possible using light-induced voltage alteration (LIVA). Using this technique, external test equipment (e.g., ATE) applies certain electrical potential and applies other conditions to the external connections of the IC to bring and hold the internal electrical states into a known static state. Then, external illumination is provided through the substrate of the IC (e.g., through to various internal areas). A change in the power supply demands from the external test equipment (e.g., ATE) as a result of perturbation from the external illumination is used to indicate the logic state of the device. Unfortunately, techniques used to date provide only gross measurements, and detection of the changes in logic are far slower than the clock rates of modern ICs, thus rendering this technique suited for only some forms of static analysis.

Photon Emission Mapping:

This legacy technique uses external test equipment to apply electrical conditions to the external connections of the IC, thus to move the internal electrical state to a particular state. Photons reflected from the various active areas at infrared (IR) wavelengths are detected with an IR camera. Emission strength indicates logic states across the field of view. Unfortunately, techniques used to date provide only gross measurements, and detection of the changes in the infrared wavelengths are far slower than the clock rates of modern ICs, thus rendering this technique suited for only some forms of static analysis.

Dynamic Laser Probing:

Laser-based illumination is reflected from the active regions carrying electronic perturbations at or near the active regions. The perturbations are converted into electrical signals by detectors. Electronic states within the IC are varied over a time period, and the changes in the perturbations are detected as the states vary over the same time period.

In some cases, the outputs of these detectors have been used with analog measurement tools to rasterize a field of view and to locate changing values that are changing at specific frequencies. Such detected frequencies are marked spatially with symbols on an image of the part. In other cases, these techniques use signal digitizing tools such as oscilloscopes. One application has been to display several cycles of a signal to measure rise time, pulse width, jitter, and other timing related parameters.

Unfortunately, the limitations inherent in the aforementioned light-induced voltage alteration, photon emission mapping, and dynamic laser probing techniques render such legacy techniques unable to meet the demands of high-speed wafer-level and at-speed testing.

Thus the time-on-tester and other practical problems attendant to the aforementioned legacy techniques can be addressed by performing precision probe positioning to take only a selected set of candidate readings, which candidate readings are then subjected to any form or forms of analysis.

SUMMARY

The present disclosure provides an improved method, system, and computer program product suited to address the aforementioned issues with legacy approaches. More specifically, the present disclosure provides a detailed description of techniques used in methods, systems, and computer program products for precision probe positioning for at-speed integrated circuit testing using through silicon in-circuit logic analysis.

Methods and systems implement techniques for determining a particular area of interest for precision probe positioning and testing of an integrated circuit, where the particular area of interest comprises an area less than an entire area of the integrated circuit. Once the particular area of interest for testing has been determined, then a laser probe is steered or otherwise directed to illuminate a plurality of pixels within the area of interest so as to generate reflected signals corresponding to the illuminated pixels. Techniques are provided for measuring the reflected signals to determine information about the IC within the area of interest. CAD data or user data can be used to determine XY addressable pixel locations within the area of interest.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

FIG. 2B depicts an area of interest selected after application of a waveform-centric analysis technique to analyze a time-based logic pattern in a loop sequence to verify and highlight mismatches in expected logic transitions, according to some embodiments.

FIG. 4A depicts user-defined patterns for reading multiple intra-cell sites having multiple charge carriers for analysis within systems that implement precision probe positioning for at-speed integrated circuit testing using through silicon in-circuit logic analysis, according to some embodiments.

FIG. 13 is a block diagram of a computer system for implementing embodiments of this disclosure.

DETAILED DESCRIPTION

Some embodiments of the present disclosure address the problem of slow and wasteful scan techniques, and some embodiments are directed to an approach to implement precision probe positioning for at-speed integrated circuit testing using through silicon in-circuit logic analysis. More particularly, disclosed herein and in the accompanying figures are exemplary environments, methods, and systems for analysis of a pre-selected set of sites for fast through-silicon in-circuit logic analysis.

Overview

Figure 1A:
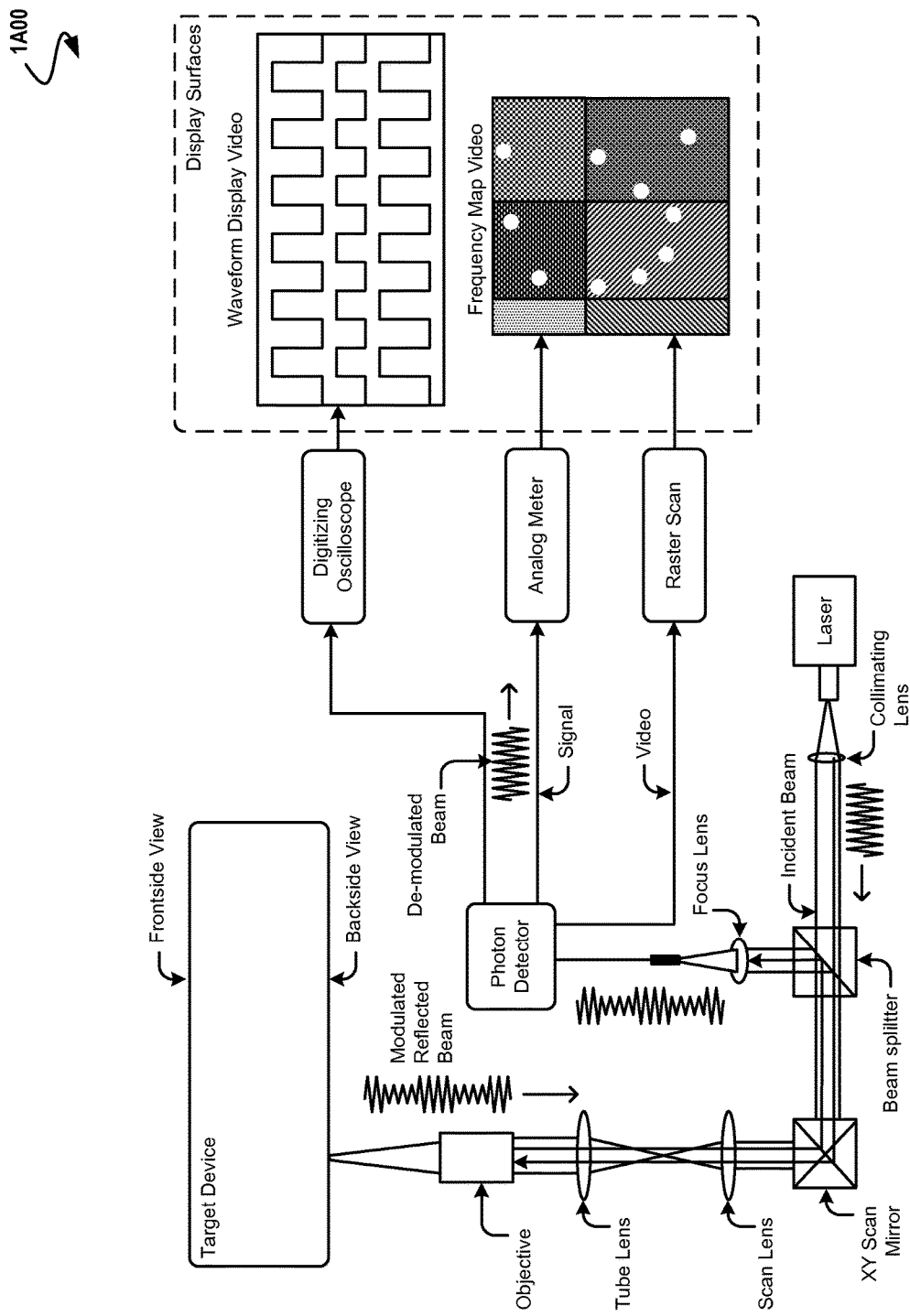
FIG. 1A is a schematic of a scanning optical microscope.

A system for precision probe positioning is depicted in FIG. 1A. As earlier indicated, legacy uses of laser probing suffer from severe limitations. Even advanced implementations of the legacy techniques have not kept pace with advances in IC design, fabrication, and test. Strictly as an example, ICs are characterized by ever smaller feature sizes, ever higher clock rates, lower and lower power operation, increasing logic complexity, and increasingly expensive time-on-tester expenses. The confluence of such advances are accompanied by the problem that acquisition of device information using legacy laser probing techniques becomes impractical. There is a need for systems and methods to quickly (e.g., at high clock rates, and at low time-on-tester) identify and locate incorrect logic states and/or identify and locate (e.g., both temporally and spatially) complex logic patterns within the internal devices comprising the IC under test.

Unfortunately, aforementioned legacy techniques are hindered by extremely low reflected signal strength necessitating multiple samples per site and resulting in the need for repeated sampling, thus resulting in very long signal acquisition times, and resulting in long time-on-tester times. Moreover, the shown analog detector tools exhibit long acquisition times due to slow responses within the analog circuitry. This causes the entire set of downstream analyses to suffer from such long acquisition times due to the need to process a large number of signal samples (e.g., to filter a large number of signal samples over a long time period in order to find a signal). In some legacy situations, the processing time required to analyze gigasamples per second of data creates "dead time" between sample bins, causing the samples to "pile up". Typically, a very large percentage of samples are rejected due to this "piling up" problem. Using the legacy raster-scan techniques, the rejected samples often exceed 99% of the total samples taken.

To overcome deficiencies of the aforementioned analog detector tools, high-speed digitizers exhibiting low latency are used. For example, one embodiment of a high-speed digitizer improves performance (e.g., decreases latency) using a dual-banked memory architecture such that samples can be collected (into one memory bank) while the other memory bank serves as a repository for access by an outboard processor. While effective use of dual-banked memory can greatly reduce the "dead time" and improving the performance, additional advanced techniques are needed to probe large numbers of candidate logic cell locations.

Figure 1B:
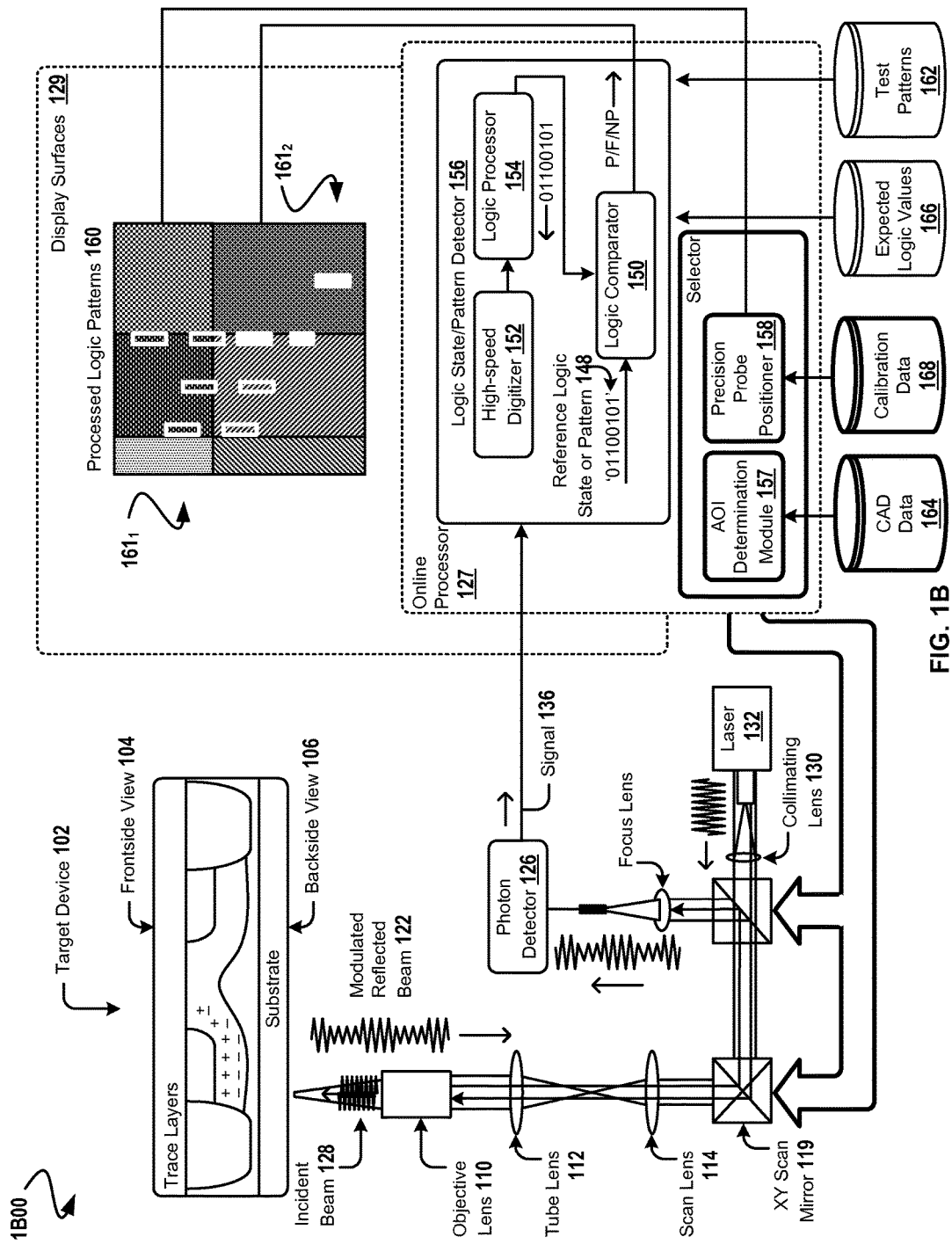
FIG. 1B is a schematic of a precision probe positioned optical microscope as used in systems implementing precision probe positioning for at-speed integrated circuit testing using through silicon in-circuit logic analysis, according to some embodiments.

Additional advanced techniques are disclosed herein, and some such techniques are referred to herein as "in-circuit dynamic logic pattern analysis" and "precision probe positioning for high-speed, through-silicon logic pattern analysis". Various embodiments of precision probe positioning for high-speed, through-silicon analysis (including dynamic logic pattern analysis) is accomplished by implementing the herein-disclosed apparatus and methods (e.g., using the apparatus as shown in FIG. 1B). Various apparatus configurations produce and receive a series of digital samples at a rate at least as high as with legacy techniques; however, since embodiments of the instant disclosure can precisely position a probe toward a determined set of pre-selected set of sites (e.g., rather than naively raster-scanning the entire substrate of the IC), the number of samples to be analyzed is substantially reduced and, accordingly, many limitations incurred by legacy raster-scanning methods is reduced or eliminated.

To illustrate an example, legacy testing technique might incur multiple types and periods of dead times. As examples:

Mismatched Triggering: Detectors trigger in ~125 µs cycles while a legacy analog oscilloscope triggers more slowly, for example at a cycle time of >100 µs. This incurs dead time of >99 µs per cycle.

Digital Signal Processing Time: Using raster-scan and oscilloscope methods, the computing latency, while processing an entire raster frame of data, can incur significant dead time. For instance, a typical frame will have >65,536 pixels, 10,000 samples per pixel at 99 µs each would take over 18 hours to complete a single frame.

In one case the scan times and dead times mentioned above reduce scan times by only probing particular points of interest (e.g., only points within particular "areas of interest") that are situated in regions where logic values or signals of interest may be present. For instance, 100 points could be probed in less than 100 sec (10,000 samples per point at 99 µs each point) even using the oscilloscope; the benefits are much higher with the high speed digitizer, 100 points could easily be probed in less than a second (10,000 samples per point at 1 µs each).

In addition, advanced high-speed processing of these digitized samples is accomplished using a combination of customized fast Fourier transforms (FFT) and customized signal processing methods. Such advanced high-speed processing facilitates real-time or near real-time comparisons with reference logic patterns to determine a match between the recovered logic patterns and expected logic patterns. The wasteful raster-scanning and frame grabber devices used in legacy systems (e.g., to rasterize the entire field of view) is replaced with a pixel-of-interest-by-pixel-of-interest approach that facilitates sparing usage of samples (e.g., only sampling as needed at locations coincident with pixels-of-interest that correspond to intra-chip devices of interest). The greatly reduced time required for implementation of the methods described in the appended figures also serve to achieve fast recovery of logic states and logic patterns. Unambiguous determination of their correctness in relation to reference values and/or reference patterns allows at-speed testing (e.g., in real-time, or at nearly real-time) using in-circuit logic analysis.

Definitions

Some of the terms used in this description are defined below for easy reference. The presented terms and their respective definitions are not rigidly restricted to these definitions—a term may be further defined by the term's use within this disclosure.

The term "Logic" or "logic" refers to logic that can be expressed in Boolean form. Such logic includes forms used to determine attributes like "true" or "false", "pass" or "fail", "match" or "mismatch", "on" or "off", "1" or "0", "bit", "qubit", "bytes", "bit word", etc.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

Reference is now made in detail to certain embodiments. The disclosed embodiments are not intended to be limiting of the claims.

DESCRIPTIONS OF EXEMPLARY EMBODIMENTS

FIG. 1A is a schematic 1A00 of a scanning optical microscope. As shown, a laser beam is incident on a target device, and the return (e.g., the shown reflected modulated beam) is directed through an apparatus (e.g., a beam splitter) to a photon detector. The outputs of the photon detector are used as inputs to various devices that transduce from photon detections into displays (e.g., waveform displays, raster-type displays, analog meters, etc.).

Unfortunately, the raster-scan techniques used in the system of schematic 1A00 suffer from many or all of the aforementioned deficiencies. What is needed is a method for testing an integrated circuit that does not rely on the wasteful raster-scan method of acquisition. What is needed is a technique to configuring a laser probe to illuminate only specific points (e.g., an area of interest) within a field of view on the substrate side of the integrated circuit. Once an area of interest has been determined (e.g., an area of interest smaller than the field of view), then precision probing directs the laser probe to illuminate only points within the area of interest. Once such points have been probed, then analysis is performed only those probed points. In some cases, the area of interest is small, thus the number of probed points is small, thus both the probing time and the analysis time is greatly reduced as compared to legacy techniques, and the time-on-tester performance is greatly improved.

Such improvements are presented in the system of FIG. 1B, as well as in other discussions throughout this disclosure.

FIG. 1B is a schematic 1B00 of a precision probe positioned optical microscope as used in systems implementing precision probe positioning for at-speed integrated circuit testing using through silicon in-circuit logic analysis. As an option, the present schematic 1B00 may be implemented in the context of the architecture and functionality of the embodiments described herein. Also, the schematic 1B00 or any aspect therein may be implemented in any desired environment.

As shown, a target device 102 (e.g., an IC) has a frontside view 104 and a backside view 106. A laser 132 produces an incident beam 128 that is directed (e.g., steered using any known techniques) to an illumination location on the backside (e.g., substrate side) of the target device. The incident beam might be collimated (e.g., using collimating lens 130) and might be polarized (e.g., using a polarizing cube, possibly with a beam splitter). The incident beam might be steered at a fixed angle by a mirror or might be steered to any arbitrary XY location (e.g., as determined by AOI determination module 157). As shown, the incident beam can be steered to any determined XY location on the backside of the IC (e.g., using XY scan mirror 119, and/or using a chuck and stage to vary the Z direction). The beam may be collimated and/or may be further conditioned using a scan lens 114, a tube lens 112, and an objective lens 110 before the beam is incident on the IC. The radiation of the beam interacts with the charge carriers within the IC, and the reflection of the beam from the IC is modulated by such interactions to create a modulated reflected beam 122. Re-traversing the incident beam path in reverse serves to steer the return through the beam splitter and into a photon detector 126.

Continuing with the discussion of the apparatus shown in schematic 1B00, outputs of the photon detector 126 include signal 136, which becomes one of several inputs to a logic state/pattern detector 156.

The output signal from the photon detector, shown as signal 136, results from detection of photons that are then transduced into an electrically-varying signal. In exemplary embodiments, the signal 136 is processed by a high bandwidth preamp and a bias tee (e.g., to separate AC components from the DC components of interest). The DC components can be used for various forms of imaging. The AC components are further amplified (e.g., using a high bandwidth amplifier) and provided to inputs of a digitizer.

The input (from signal 136) is digitized (e.g., using a high-speed digitizer 152) to recover changes in the signal corresponding to detected logic values and/or logic value changes. A logic processor 154 processes the detected logic values and/or logic value changes to put the received signal into a form suited for comparison with logic values retrieved from a database. For example, and as shown, the logic state/pattern detector 156 can retrieve logic values from test patterns 162 and/or from expected logic values 166. Thus, given a string of logic values from the logic processor 154 and a string of logic values from expected logic values 166, a logic comparator 150 can be employed to determine a pass (P), or fail (F), or not present (NP) indication. Various such indications corresponding to pass, or fail, or not present are further discussed below.

As shown, signal 136 is processed through an online processor 127 and results of the online processor 127 (e.g., results of the logic comparator) are displayed on display surfaces 129, for example, showing locations and/or logic values and/or waveforms of processed logic patterns 160.

As shown, the CAD data 164 and calibration data 168 are used with a precision probe positioner 158 to control the steering such that the incident beam is positioned at a particular XY location on the backside view 106 of target device 102. The AOI determination module 157 can be used to facilitate calibration (e.g., to position the laser to positions were registration points and/or logic values are known). For purposes of calibration and for other reasons, the CAD data 164 and calibration data 168 are used to control the photon detector 126 such that at least some of the reflection of the incident beam is detected at the photon detector 126.

Reference Patterns

Figure 2A:
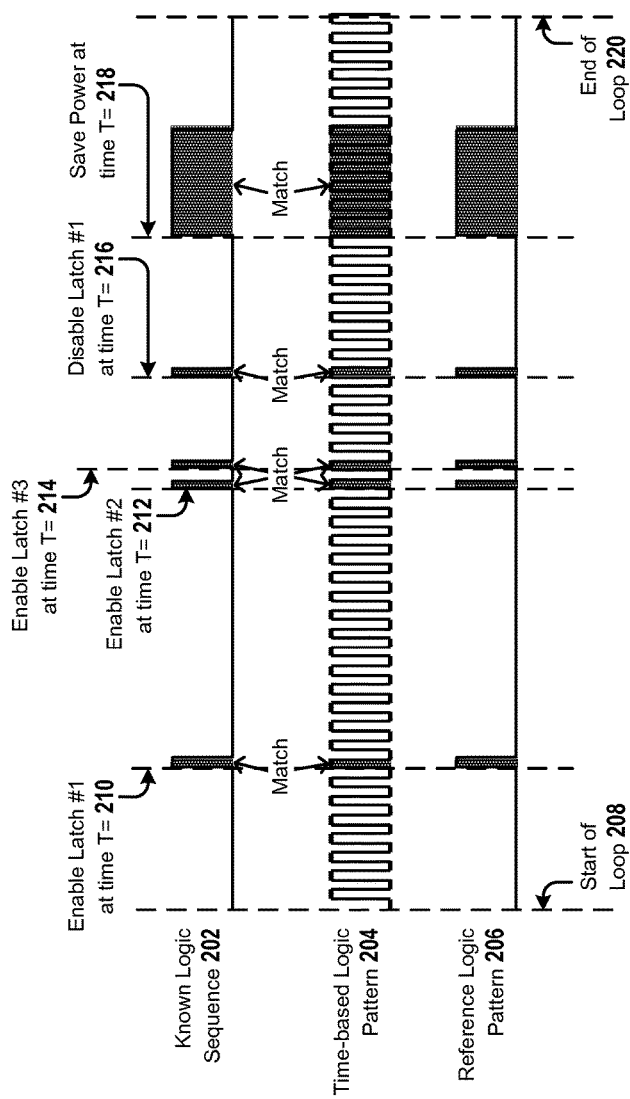
FIG. 2A depicts a waveform-centric analysis technique to analyze a time-based logic pattern in a loop sequence to verify and highlight expected logic transitions as used in systems implementing precision probe positioning for at-speed integrated circuit testing using through silicon in-circuit logic analysis, according to some embodiments.
Figure 2C:
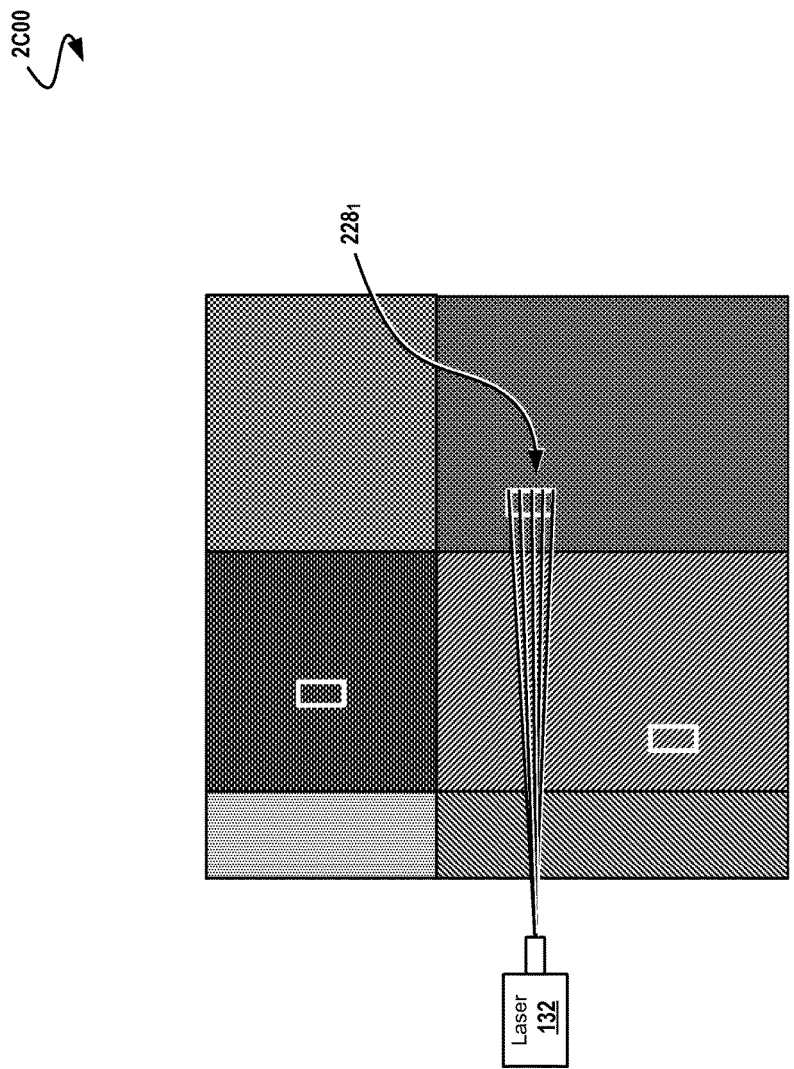
FIG. 2C depicts an area of interest selected using a database to determine locations of cells of a certain type, according to some embodiments.

Now, further discussing techniques employing reference patterns, the reference patterns may be generated by capturing patterns of interest based on:

The geometric characteristics of an area or areas of interest (see FIG. 2A-FIG. 2C).

Other circuit locations within the same IC or other ICs (see FIG. 3A-FIG. 3E). For instance, a logic pattern measured at the first cell of a scan chain can be used as a reference logic pattern to apply to scan cells further down the chain. Thus, a reference pattern can be used to search for the location of a broken cell in the scan chain.

Figure 4B:
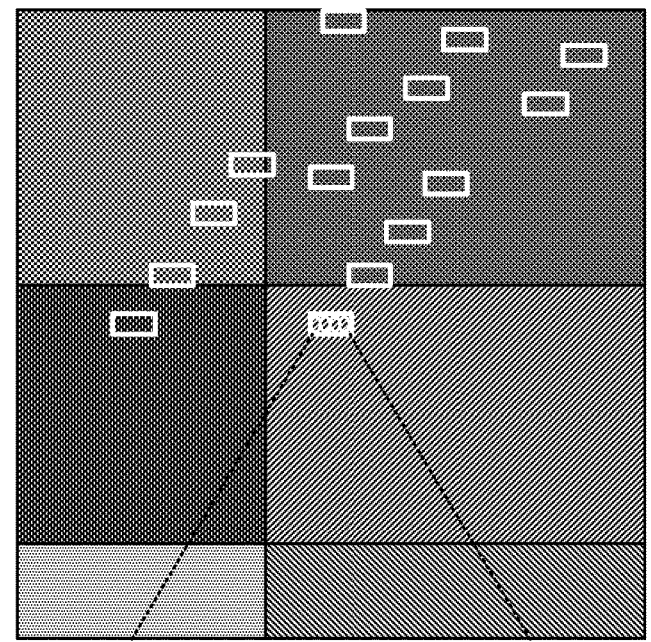
FIG. 4B depicts user-defined patterns for reading multiple intra-cell sites having multiple charge carriers for analysis within systems that implement precision probe positioning for at-speed integrated circuit testing using through silicon in-circuit logic analysis, according to some embodiments.
Figure 4B:
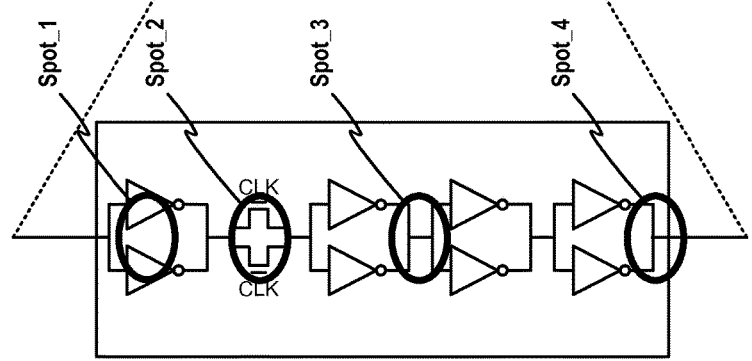

Direct input from the user (see FIG. 4A-FIG. 4B).

Figure 5A:
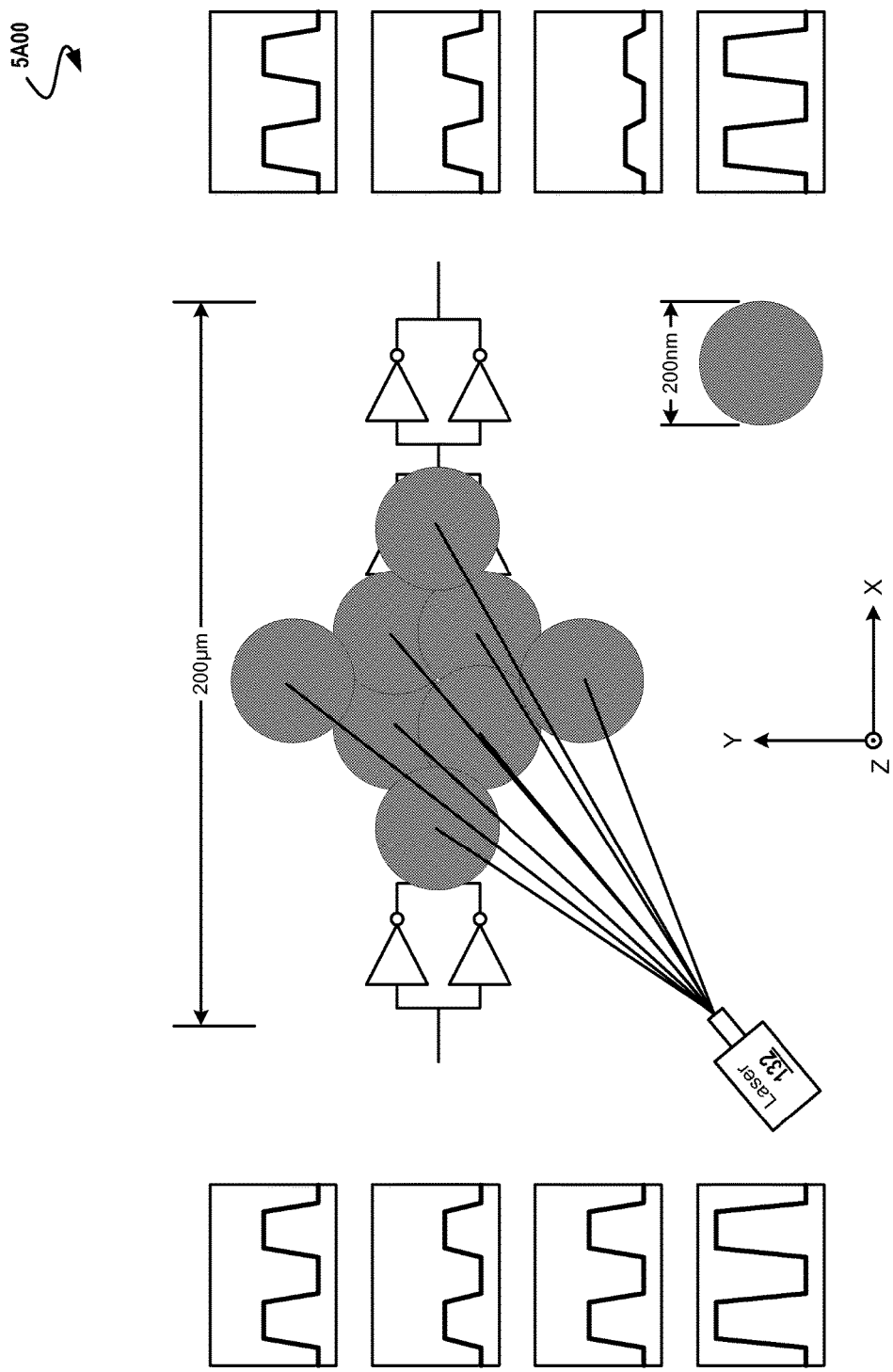
FIG. 5A is a sweet spot scatter plot used to empirically identify a set of sweet spot hit locations as used in conjunction with precision probe positioning, according to some embodiments.
Figure 5B:
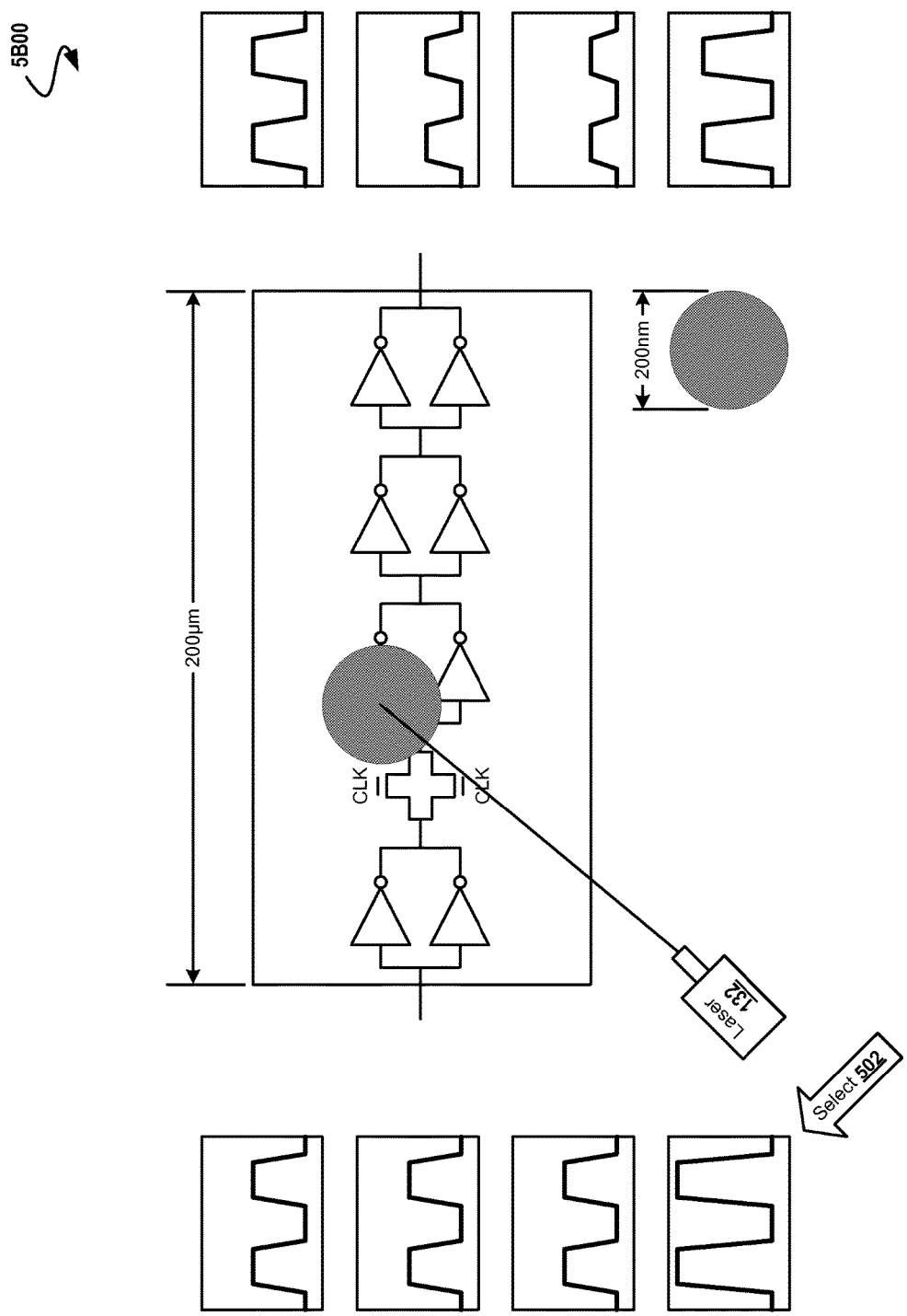
FIG. 5B is a sweet spot hit plot used to empirically identify selected sweet spot hit locations after feedback from a sensor, as used in conjunction with precision probe positioning, according to some embodiments.
Figure 5C:
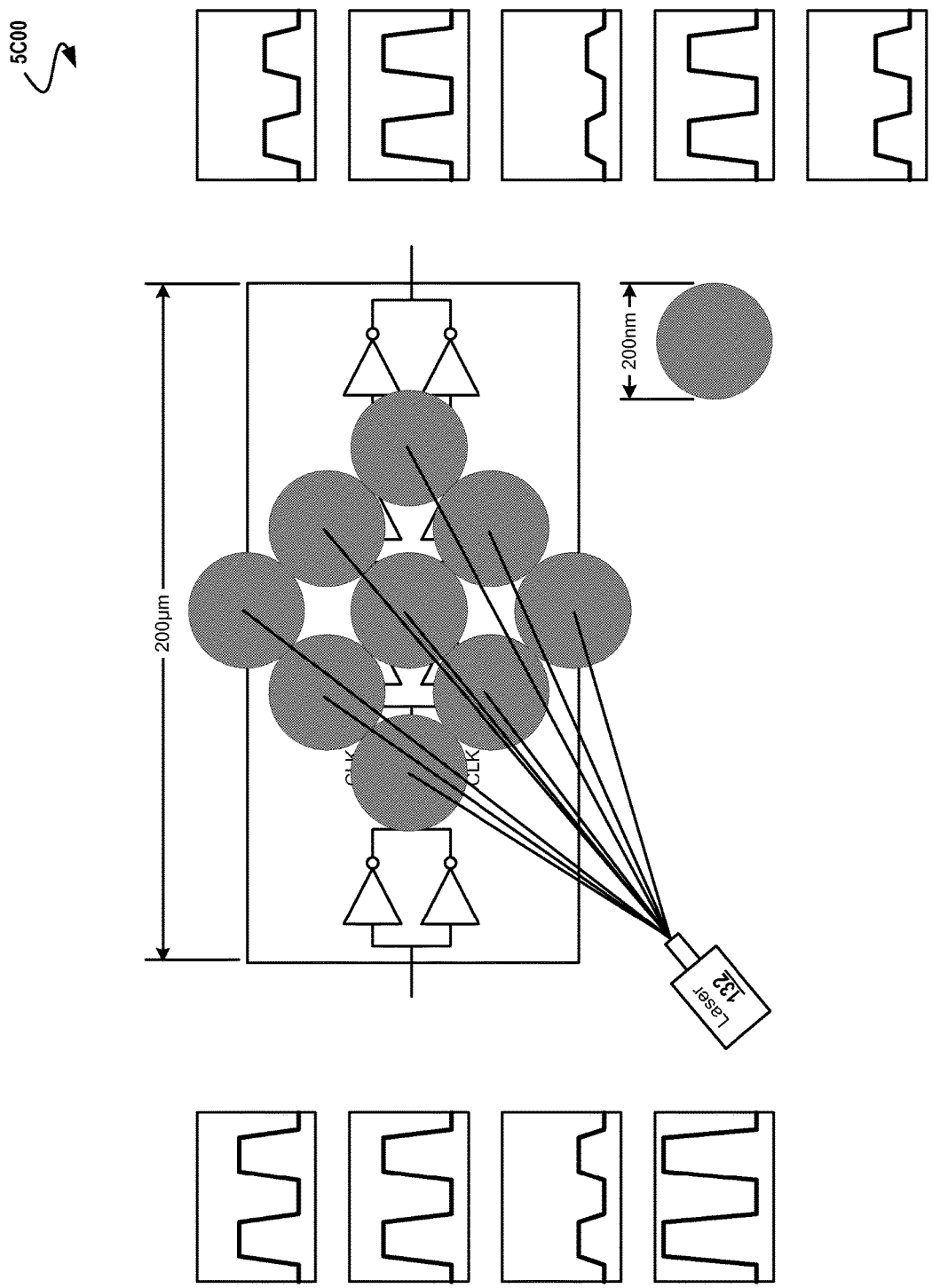
FIG. 5C is a non-overlapping sweet spot scatter plot used to empirically identify a set of sweet spot hit locations as used in conjunction with precision probe positioning, according to some embodiments.

Initial analysis from an initial set of probe points (see FIG. 5A-FIG. 5C)

Figure 6:
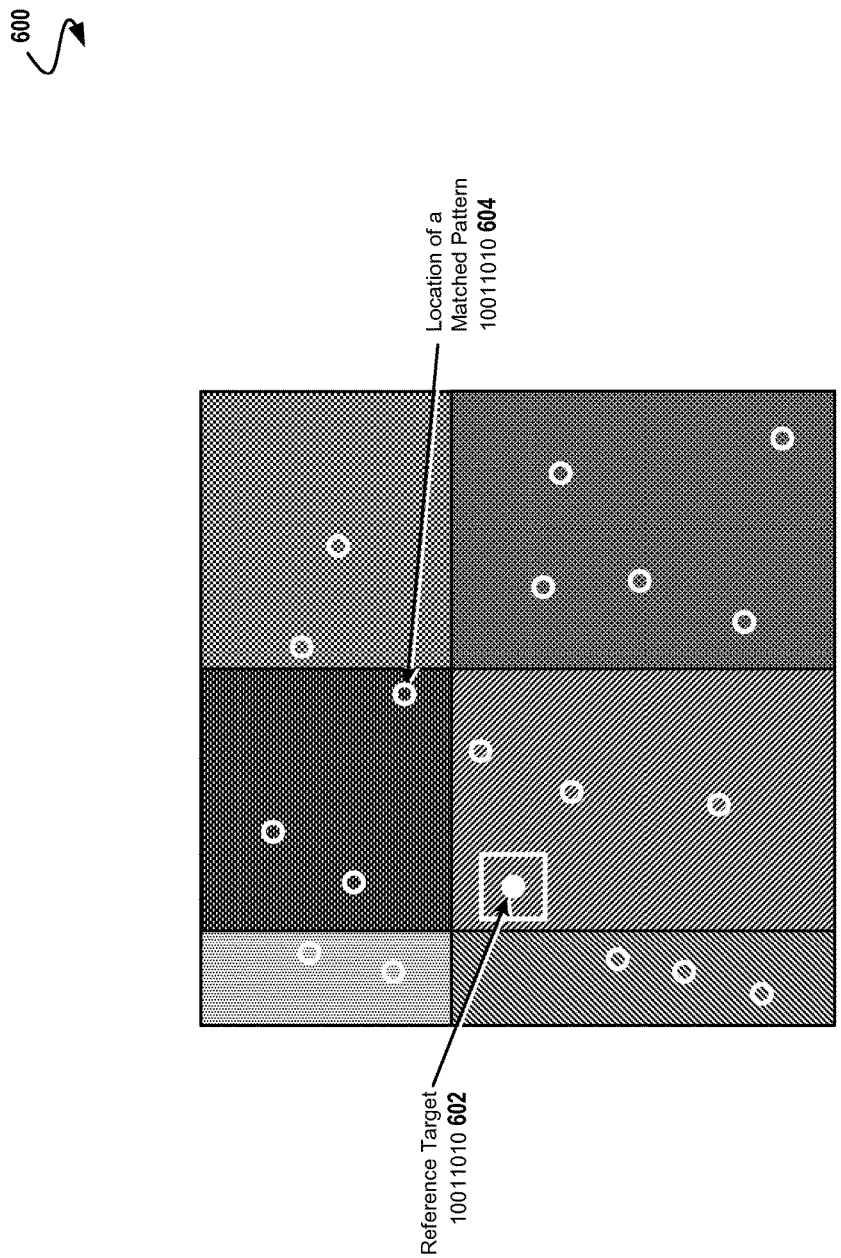
FIG. 6 shows highlighting imagery superimposed over a selected field of view of a portion of an integrated circuit under test in a system for precision probe positioning for at-speed integrated circuit testing using through silicon in-circuit logic analysis, according to some embodiments.

External test equipment (see FIG. 6).

Figure 7:
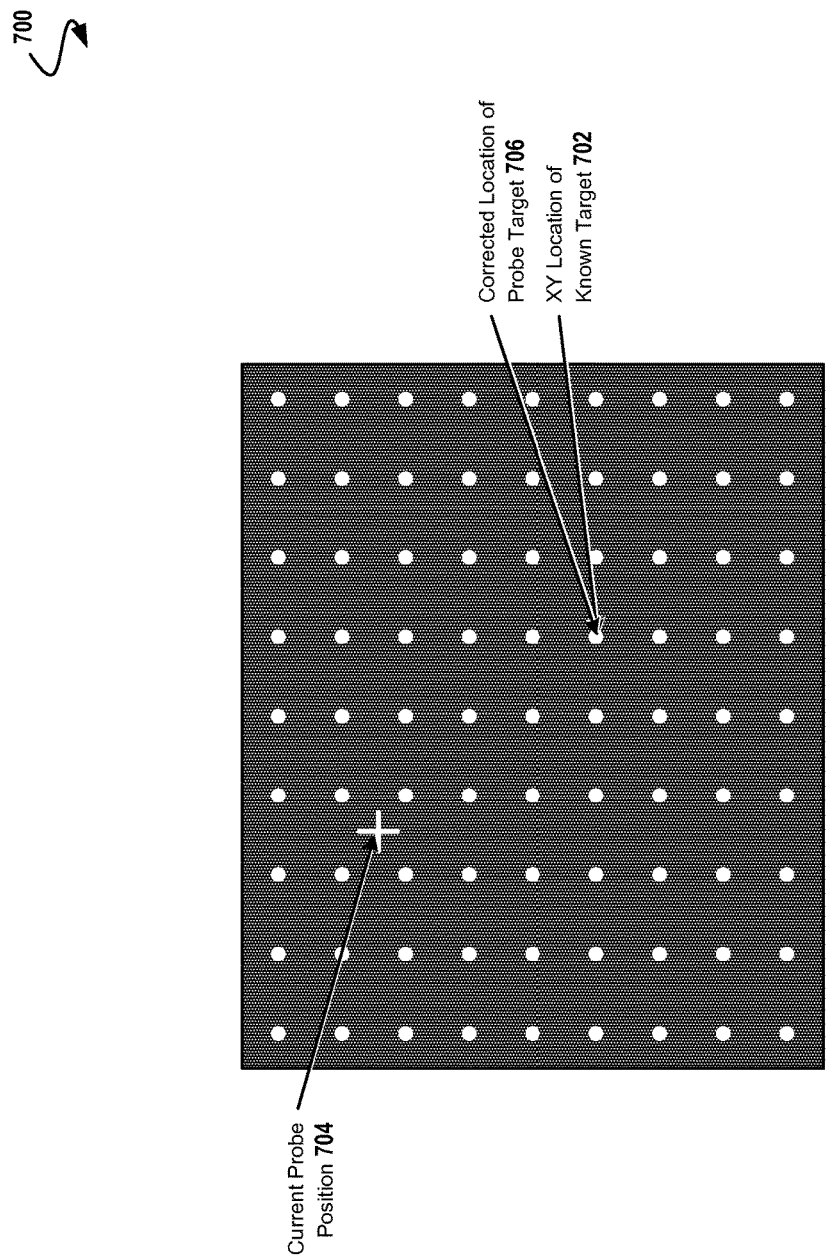
FIG. 7 shows a high magnification of a very small field of view used during misalignment detection for analyzing an integrated circuit under test in a system for precision probe positioning for at-speed integrated circuit testing using through silicon in-circuit logic analysis, according to some embodiments.

Calibration data (see FIG. 7).

Other external software.

Strictly as examples, designers of ICs have knowledge of expected logic states and patterns that exist within their IC such as from logic simulation, from fault simulation, from automatic test pattern generation (ATPG), etc. Some logic states may comprise a repeating cycle, such as in the case of "clocks" or "clock trees". These clocks may be used to step logic states or functions within the IC. In another example, the logic states may be grouped into logic patterns arranged as logic words used to instruct actions in various portions of the IC. Logic patterns may also be stored in blocks of information in the memory areas of the IC. Some ICs have designs that place special circuitry (e.g., built-in self-test (BIST) circuitry) located in pre-defined areas of the IC. Such special circuitry is used to provide additional "test" information about operation of the IC for the designers. A common example of such special circuitry is "shift registers" that are placed in cascades or chains commonly referred to as "scan chains". Special logic patterns (e.g., fault simulation vectors) are passed through the scan chains in order to load in known test patterns and then detect failures within the IC where the measured results do not match the expected results. In some cases, sequences of measurements (e.g., detected behavior within the IC where the measured results do not match the expected results) can be fed into a simulator, and the simulator can hypothesize as to the causes, sources, and locations corresponding to why measured results do not match the expected results.

As indicated, a simulator can hypothesize sources and respective locations (e.g., transistors, traces, gates) of possible causes of the detected mismatch, and the spatial positions of such locations can be used to determine an area of interest. The XY coordinates of the spatial position can then be used to direct the laser probe to the determined area of interest to precisely probe only points within the determined area of interest. In some cases multiple areas of interest are selected, and points within the respective multiple areas of interest are probed in a sequence (e.g., see FIG. 3D).

Additional techniques discussed herein serve to spatially locate (e.g., using XY coordinates) target areas of interest such as the active region of transistors or other electronic devices (e.g., electronic devices within shift registers) in order to direct the illuminating laser beam only to these specific target areas. A pass, fail, or non-presence condition may be reported to the user, external test equipment, or converted into visual indicators and superimposed spatially on the IC image or a graphical representation of the circuit components (e.g., see processed logic patterns 160). Visual indicators 161 may be rectangles (e.g., indicator $161_1$, indicator $161_2$, etc.), dots, binary strings, or other formats useful to the user. For example, an image of each of the abovementioned shift registers may be outlined with a green (or open) rectangle for pass, or a red (or solid) rectangle for fail, or some other screen device to represent no modulation. If the user's software provides sequencing, this method would also provide spatial and logical determination of the specific location of the mismatched register in the sequence. A mismatched register in the sequence or other behavior classified as 'failed' might actually be located to an area of interest corresponding to an area in between the last 'passing' cell and the first 'failed' cell. Formats or display techniques other than the aforementioned rectangles may be used.

As can be seen, use of the herein-disclosed techniques and systems eliminates or greatly reduces "dead time" as well as overall measurement-taking and analysis times. Embodiments such as is shown in the online processor 127 of FIG. 1B serve to rapidly determine correctness (e.g., matching values) of logic states or logic patterns. Further, such techniques and systems can also be used to significantly improve recovery time of a signal waveform from optical measurements. In some cases, a high-speed digitizer can receive emitted or reflected signals from a target location within an IC, and can then render a waveform. Such a waveform can be rendered into "logic" or Boolean form for logic comparison purposes.

Figure 1C:
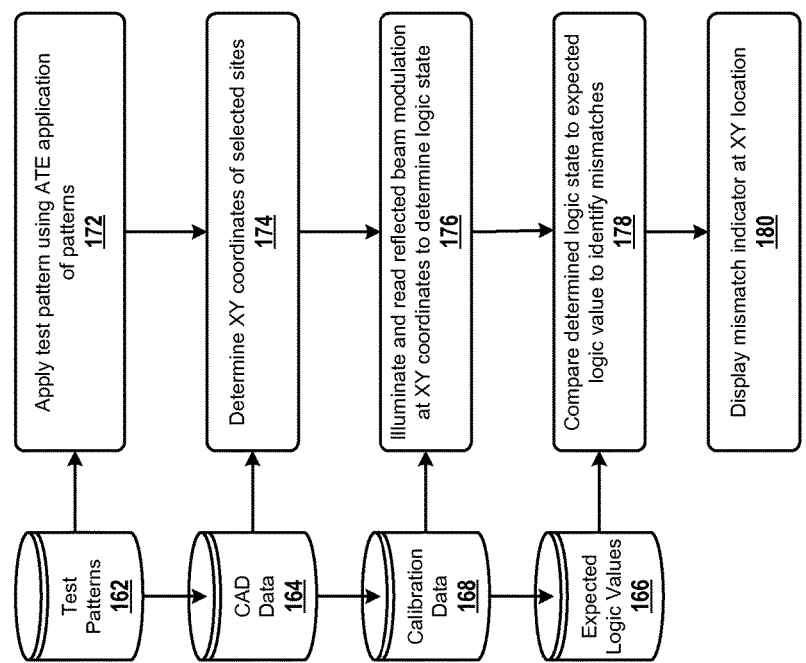
FIG. 1C is a flow chart showing a procedure to identify logic mismatches in systems that implement precision probe positioning for at-speed integrated circuit testing using through silicon in-circuit logic analysis, according to some embodiments.

FIG. 1C is a flow chart 1C00 showing a procedure to identify logic mismatches in systems that implement precision probe positioning for at-speed integrated circuit testing using through silicon in-circuit logic analysis. As an option, the present flow chart 1C00 may be implemented in the context of the architecture and functionality of the embodiments described herein. Also, the flow chart 1C00 or any aspect therein may be implemented in any desired environment.

As shown, a database of test patterns 162 can be used to drive automated test equipment (see operation 172), and CAD data 164 can be used to determine specific XY coordinates in order to steer the laser (and detector) to selected sites (see operation 174 and operation 176). Once the site or sites have been illuminated using precision positioning of laser probes, then the photon detector 126 can determine logic values at said selected sites (again see operation 176), which can be compared with expected logic values 166.

In some cases, the illumination equipment is calibrated so the actual site illuminated matches with precision to the CAD data. Calibration data 168 can be collected ahead of a series of tests. In some embodiments, the system performs a three-point calibration alignment to translate device coordinates from the database into stage coordinates of the system (e.g., see precision probe positioner 158). Thereafter, the spatial location of logic cells (e.g., scan cells) can be translated to the scanning optical microscope (SOM) stage coordinates and then scanned or probed within the cell(s) only in the form of separated automated optical inspections performed within an area of interest.

Given the illuminated site, measured return, and determined logic values at said XY sites (see operation 176), the determined logic value can be compared to expected logic values (see operation 178). Matches and mismatches can be displayed (e.g., using visual indicators 161) at corresponding XY locations on a display surface (see operation 180).

A match of a particular probed logic value can be displayed. Or, a mismatch can be displayed. In some embodiments a particular time-series of logic values is needed to verify expected operation. A time-based logic pattern in a loop sequence (e.g., using a generated reference logic state or pattern 148) can be used in conjunction with precision positioning of a laser probe to illuminate specific XY sites in order to read the time-variant logic values at said sites.

FIG. 2A depicts a waveform-centric analysis technique 2A00 to analyze a time-based logic pattern in a loop sequence to verify and highlight expected logic transitions as used in systems implementing precision probe positioning for at-speed integrated circuit testing using through silicon in-circuit logic analysis. As an option, the present analysis technique 2A00 may be implemented in the context of the architecture and functionality of the embodiments described herein. Also, the analysis technique 2A00 or any aspect therein may be implemented in any desired environment.

The analysis technique of FIG. 2A shows an a priori known logic sequence 202 of logic states. The known sequence of logic states contain states that enable other circuit actions such as switching a latch or executing power down to sections of the circuitry. In this embodiment, a time-based logic pattern 204 is generated as is appropriate to the known chain conditions. Expected occurrences or periods of "matches" between the known states and the time-based logic pattern are used to create a reference logic pattern 206 that may then be used in testing for the expected sequence in a loop (see start of loop 208 and end of loop 220). The time-based logic pattern may also be devised such that timing failures (e.g., violated setup or hold conditions) may be detected and subsequently reported.

As shown, a reference pattern is generated, which reference pattern is compared to a series of measured logic states. In the case of the waveforms of FIG. 2A, the reference pattern (e.g., the shown series of logic states) is used to enable and disable latches (e.g., see time T=210, T=212, T=214, T=216) and to power-down sections of the circuitry (e.g., see time T=218). In some cases the reference pattern follows a repeating pattern, and as such, may be considered as a loop. The reference pattern and the measured logic states are compared (e.g., using logic comparator circuitry), and the comparison determines a match/no-match for each clock cycle. The "matched" bits are then used for pass/fail testing criteria. Filters, pre-emphasis, and other signal processing techniques can be used to facilitate detection of timing errors (e.g., set-up or hold time violations) in and around the edges of the acquired logic states.

As pertaining to precision probe positioning for at-speed integrated circuit testing, the time-on-tester for performing this testing for the expected sequence in a loop is dramatically reduced from the legacy raster-scan techniques. Using precision probe positioning techniques, only the probe readings from a relatively small set of electronic devices need to be collected in order to empirically measure the sequence of logic values for comparison to the reference pattern.

Since the time needed for empirically testing the expected sequence is dramatically reduced as compared to the legacy raster-scan techniques, a software module can be used to loop a test and compare the recovered logic states (and timing information) to a reference signal in order to determine correctness of the logic patterns and to verify observation of timing constraints. The loop can be executed, and executed again in a repeating pattern, such that so long as the expected patterns of the loop are present for real-time probing, the area of interest remains visibly highlighted. For example, an area on the display surface corresponding to a particular XY location can be highlighted.

The aforementioned reference pattern(s) can be determined from simulation data, or from user-defined patterns, or can be derived from measured "known good" cell behavior. The comparison can be done without regard to phase (amplitude correlation) or phase correlated if required since the phase information is collected. In some cases, a logic pattern (e.g., changing values over a time period) might exactly match expected values as the phase of the reference signal is shifted. The phase shifting can also be shown in conjunction with a waveform image, or can be presented as isolated phase information.

Such reference patterns can be extensive, and can be performed at high speed. Error checking methods within the system can validate pattern matches or non-matches. For example, by using extracted logic states, bit error checking methods can be applied to reduce false negative errors. In fact, following the techniques disclosed herein, it is possible to check proximal logic (e.g., down-stream logic) to see if the failed bits "recovered"; in that case, a previously-reported mismatch can be deemed to be a false negative. Such error checking and classification of false negatives greatly improves the accuracy of the results and performs better overall as compared to previous methods. As another example, application of algorithms to perform checking logic patterns in and around areas of interest can report non-matching observations in order to localize logic failures.

In some cases the correlation of non-matching observations serve to isolate electronic device faults to within proximity of one gate. For example, when observing an IC from the backside using a precision laser probe, false positives and false negatives can occur. The algorithm can check to see that a logic chain is consistent. Downstream error checking can confirm that multiple logic elements in the chain downstream continue to fail or not so as to identify or classify "false failures". For example, if the subsequent logic succeeds (i.e., is deemed as a pass) or if the chain is deemed to have "recovered", then the earlier mismatched cell can be deemed to be functioning properly, and the mismatch can be classified as a "false failure". Such techniques can be used repeatedly in order to calculate a particular correlation probability.

For example, one technique checks downstream logic even in the event of a 'false' or 'fail'. A 'false' might have occurred merely because of missing a site or a weak signal, however, if the next (e.g., downstream) logic cell "recovers", then it is a statistical probability that the previous cell was in fact good. This situation is known as a "false negative" or "false fail". Statistical metrics can be applied. For example, a corpus of samples can be taken from techniques such as laser assisted device alteration (LADA) that monitor pass/fail indications. Given such a corpus, the probability of observing a "false pass" might be known to be very small, but observing a "false fail" is more common. Hence, classification algorithms can be weighted accordingly for classifying observations into "false negative" suspects versus "false pass" suspects.

As earlier indicated, BIST can be provided on-chip and can be enabled (e.g., in conjunction with ATE). Accordingly, BIST and periphery stimulation can be used in tandem to implement various testing schemes. For example:

Precision probe positioning can be used to implement spatial random or pseudo-random samples within the area of interest (AOI).

Precision probe positioning can be used to implement spatial random or pseudo-random samples within sub-AOIs (SAOIs) within the AOI.

Intra-Cell Probing

Defining areas of interest (AOIs) based on the logic sequence helps further reduce the area or sites to be selected for precision laser probing. Area refinement can be further enhanced by breaking down the AOIs into SAOIs and sample randomly within the AOI or SAOI. Strictly as an example, SAOIs can be used to identify candidate areas (e.g., promising areas) for a signal, and using precision probe positioning the SAOI then can be still further sampled without the need to repeat the larger AOI set of probes. In some situations, identification of SAOIs can be used to improve laser-assisted device alteration (LADA/SDL) where pass/fail "hits" are observed. SAOIs can be explicitly defined to be areas within a cell, and clusters of "hits" observed in a first scan of an AOI or SAOI can be subjected to further observations (e.g., by further probing either the front side or the back side of the device) in order to confirm the presence (or absence) of a signal.

FIG. 2B depicts an area of interest 2B00 selected after application of a waveform-centric analysis technique to analyze a time-based logic pattern in a loop sequence to verify and highlight mismatches in expected logic transitions.

As shown, an electronic device (e.g., a latch) can be deemed to be a mismatch with respect to expected logic transitions. In such a case, the incident beam 128 can be steered to illuminate the electronic device suspected to be a cause of the mismatch. Then, high-speed tests can be performed and the mismatch can be characterized vis-á-vis dynamic logic constraints (e.g., setup and/or hold constraints).

In some cases, more than one electronic device might contribute to the occurrence of a mismatch. A logic database can be used to form hypotheticals. As is known in the art, a mismatch at a particular point in a circuit can be caused by a failure directly at that point, or it can be caused by an input to the electronic device, or it can be caused by a still further upstream effect. In digital circuitry, the upstream circuitry forms a "cone of logic" such that if a failure (e.g., a "stuck-at" failure) is detected at a particular electronic device, then the detected stuck-at fault can be a consequence of a stuck-at condition at the particular electronic device, or it can be a consequence of a stuck-at condition in upstream circuitry. Using the techniques of precision probe positioning, the true source of a detected stuck-at fault can be determined by precision probing electronic devices in the upstream circuitry. A CAD database can be used to determine the XY location of an upstream element, and the XY location of the upstream element can be probed.

FIG. 2C depicts an area of interest 2C00 selected using a database to determine locations of cells of a certain type. For example, a failure hypothesis might include a suspicion that a cell of a certain type violates a design rule and thus is the root cause of a swarm of failures. An experiment might be run using the techniques of precision probe positioning so as to probe only occurrences of those types of cells. The XY location of such a cell (e.g., cell 228) can be derived from a CAD database, and just that cell can be probed and analyzed (e.g., to determine a match or mismatch).

In some cases, a fault might not occur at some low frequency of operation, but then does begin to occur at some higher frequency. Precision probe positioning can be used to read logic values at a particular gate, and a sequence of repeated readings can be collected as the operating frequency is increased.

In fact, using precision probe positioning, cells that are distally located across the field of view can be probed at speed. In some cases, a "hopping" algorithm is employed so as to reduce the effects of the laser probe (e.g., a temperature effect, a residual charge effect, etc.). When a laser dwells for a long period in a region, thermal heat and/or free carrier charge can build up. This can cause damage to the device (heat) or perturb the circuit in undesired ways (photo-current injection). Precision pixel positioning can be especially useful for SDL/LADA where excess charge and heat from sequential scanning can build up excessive heat and charge while scanning in areas that are not of interest. Even if you want to scan the entire field of view, random probing whether logic analysis or SDL/LADA can help produce more statistically valid results. In some cases, random sampling techniques can be used so as to collect aggregate results, which results can be used to derive a statistical certainty (e.g., a confidence interval). Other known-in-the-art sampling techniques can be used so as to present data that is unbiased, or is biased only within a calculable and statistically certain interval. In some cases, the phenomenon of hysteresis is observed when using sequential scanning techniques, and such phenomenon can be considered in statistical analysis of the reflections from the laser probe.

Figure 2D:
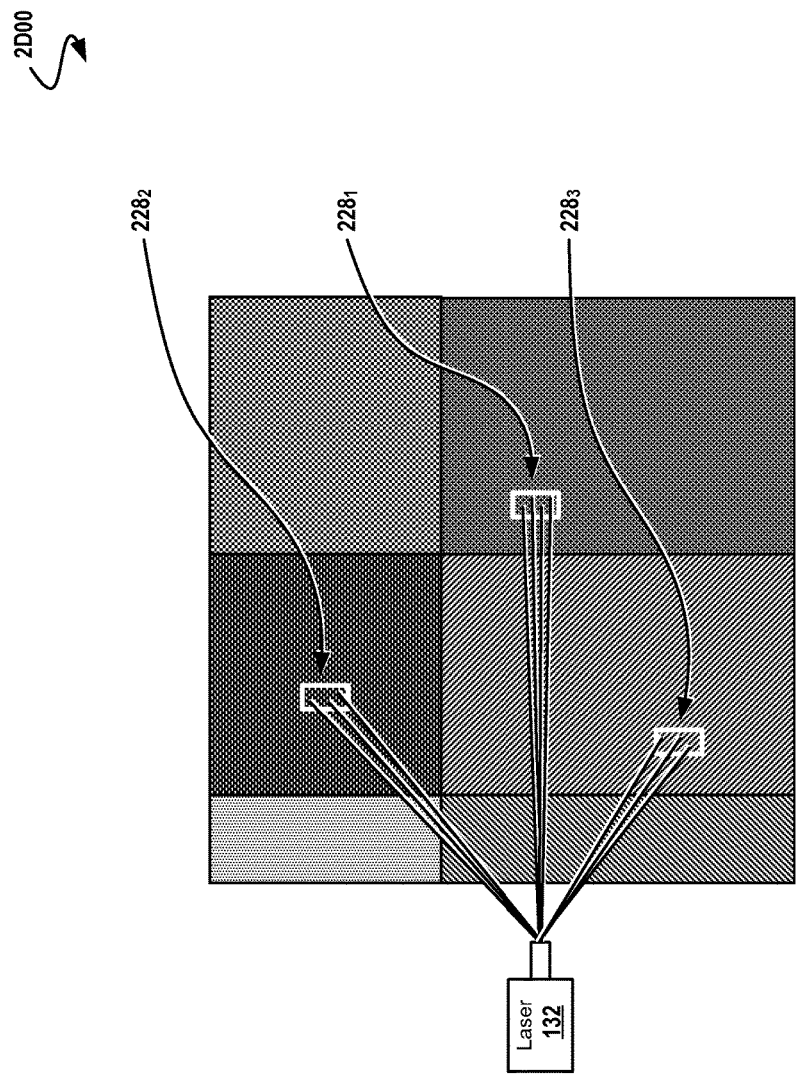
FIG. 2D depicts a field of view comprising several selected areas of interest to implement hopping techniques, according to some embodiments.

FIG. 2D depicts a field of view 2D00 comprising several selected areas of interest to implement hopping techniques.

As shown, a set of AOIs are determined (e.g., using a CAD database to determine locations of cells), and the laser 132 is precisely positioned in a "hopping" succession in order to read the logic value at successive cells (e.g., cell $228_1$, cell $228_2$, cell $228_3$). In such a manner, many tests can be performed concurrently (e.g., within the same cycle of a synchronous digital system). Moreover, many tests can be performed concurrently using hopping so as to reduce the aforementioned effects of the laser probe.

Figure 3A:
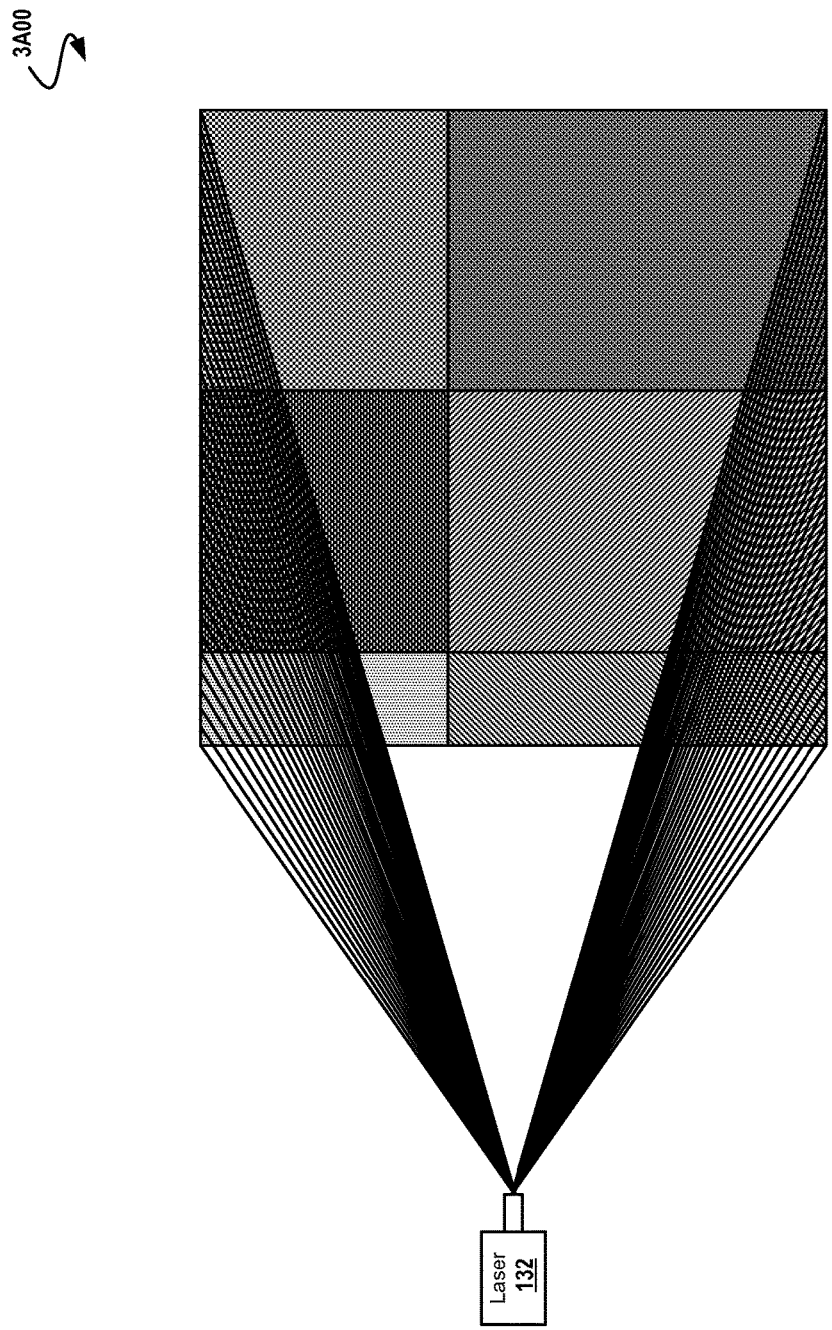
FIG. 3A depicts area of interest prediction using a sweep-scan as used in systems that implement precision probe positioning for at-speed integrated circuit testing using through silicon in-circuit logic analysis, according to some embodiments.

FIG. 3A depicts area of interest prediction using a sweep-scan 3A00 as used in systems that implement precision probe positioning for at-speed integrated circuit testing using through silicon in-circuit logic analysis, according to some embodiments.

As shown, a sweep-scan is performed at the periphery of the IC (or portion thereof) in a test intended to check for oscillating I/O cells. The example of I/O cells is merely one example and, in some embodiments, one or more AOIs may be defined based on bounding information extracted from a CAD database (e.g., GDSII). In some cases, much of the IC area is used for regular structures (e.g., DRAM) and/or for routing; thus an IC might be only sparsely populated with logic.

In certain testing situations, a sweep-scan can be emulated by precision positioning, and an AOI can be defined to correspond to a sub-area within the sweep-scan region. Strictly as one example, a bridging fault might cause unintended feedback which in turn generates oscillations in circuitry around the bridging fault. Such an undesired oscillation can be detected in the course of a sweep-scan, the analysis from which can identify oscillating circuitry, and can pinpoint such oscillating circuitry to a specific XY area of interest.

In this and many other logic testing situations, limiting probing to only true areas of interest (e.g., an area where there is logic of interest) serves to avoid wasted time and cycles dedicated to probing areas that cannot yield any useful logic states or signals or timing information as related to the logic of interest (LOI).

Figure 3B:
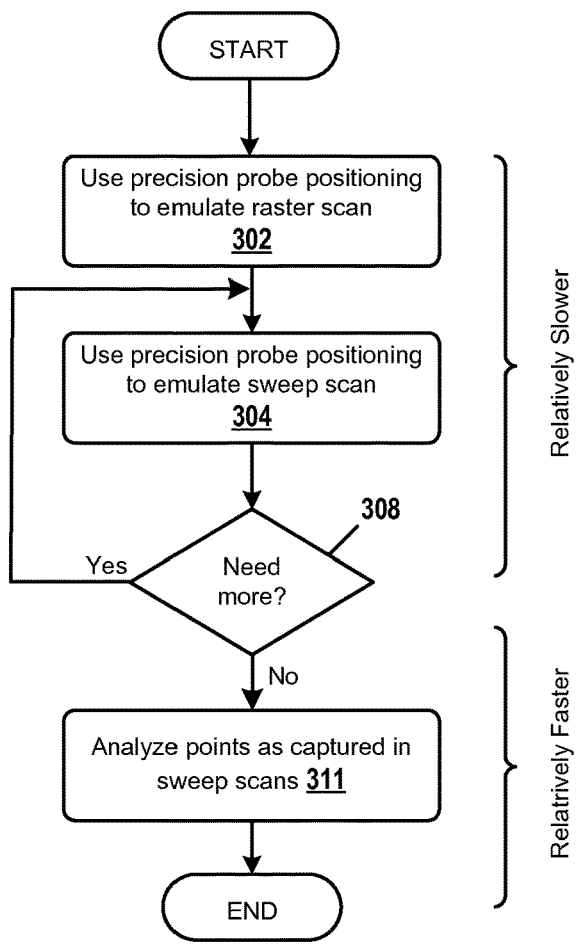
FIG. 3B depicts a bounding technique to identify an area of interest based on overlay results from multiple sweep-scan passes as used in systems that implement precision probe positioning for at-speed integrated circuit testing using through silicon in-circuit logic analysis, according to some embodiments.

FIG. 3B depicts a bounding technique 3B00 to identify an area of interest based on results from multiple sweep scans using precision probe positioning for at-speed integrated circuit testing. As an option, the present bounding technique 3B00 may be implemented in the context of the architecture and functionality of the embodiments described herein. Also, the bounding technique 3B00 or any aspect therein may be implemented in any desired environment.

As shown, the method commences by using precision probe positioning to emulate a raster scan operation or a portion of a raster scan (see step 302). Based on analysis of the return from the raster scan, a smaller area or line can be determined. Then precision probe positioning can be used to emulate a sweep scan operation or a portion of a sweep scan (see step 304). As is now understood, a sweep scan can be precise, and in some cases multiple sweep scans can be performed in rapid succession. Accordingly it is possible to perform successive sweep scans that cover multiple portions of the field of view, and a test (e.g., see decision 308) can be performed iteratively to assemble multiple portions of the field of view, which portions can then be sweep scanned and re-scanned.

The determined areas of interest (e.g., including corresponding bounding peripheries) serve for configuring a laser probe to illuminate points only within the areas of interest that fall within a field of view on the substrate side of the integrated circuit.

Since the scanning (see step 302, step 304, decision 308) and analysis (see step 311) can be limited to only those areas of interest (e.g., areas of interest that are relatively smaller than the field of view), re-scanning can be performed at a high re-scan frequency. Such high-frequency re-scanning of areas of interest are not limited to re-scanning using sweep-scans. In fact, and as further discussed as pertaining to FIG. 3C, any arbitrarily-shaped and arbitrarily-positioned AOIs can be scanned in rapid succession.

Figure 3C:
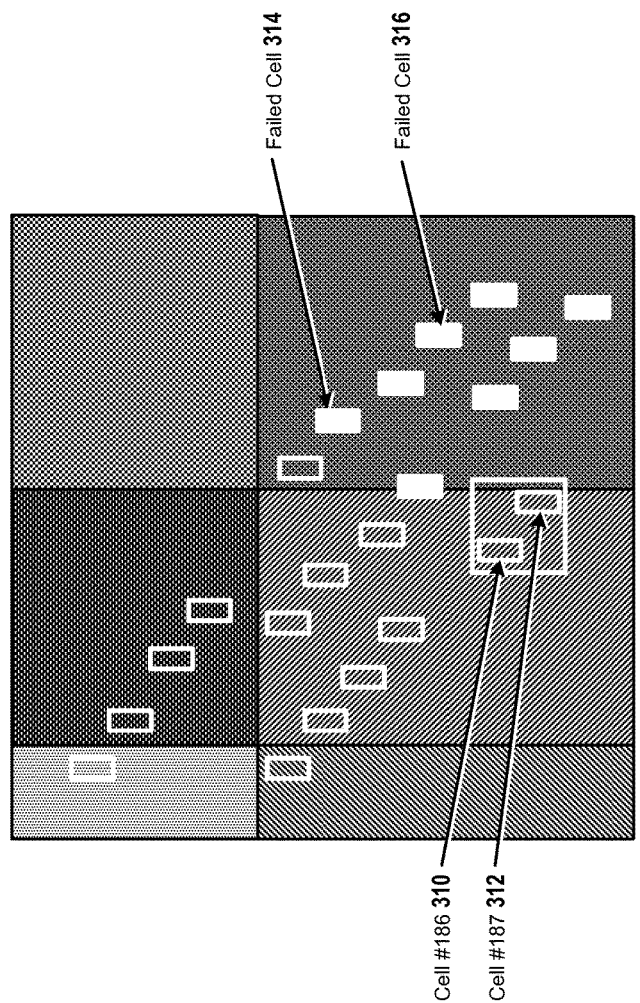
FIG. 3C is a field of view showing a logic chain that is observed to have failures in certain cells, according to some embodiments.

FIG. 3C is a field of view 3C00 showing a logic chain that is observed to have failures in certain cells. As shown, the arbitrarily-shaped and arbitrarily-positioned AOIs form a logic scan chain. In some cases a particular sequential element is read to empirically determine a logic value that can be compared to an expected logic state. Referring again to the system of FIG. 1B, the output of the logic comparator 150 marks some cells as PASS and some cells as FAIL. For example, the rectangles referring to PASS areas are green or open (see cell 310, cell 312) and the rectangles referring to FAIL areas are red or solid (e.g., see cell 314, cell 316). In some cases, and as shown here, the rectangles are identified with numbered cells (e.g., cell #186 310, cell #187 312, etc.).

Of course color or pattern coding is not the only way to visually assist a human operator, and some embodiments employ usability functions to directly overlay the user-defined AOIs as "boxes" or other geometrical shapes that outline each AOI. In some cases a user-defined AOI can serve to create a bounding area of target sites from which sites the XY-addressable laser probes can be steered to extract static or dynamic logic states and timing information.

Figure 3D:
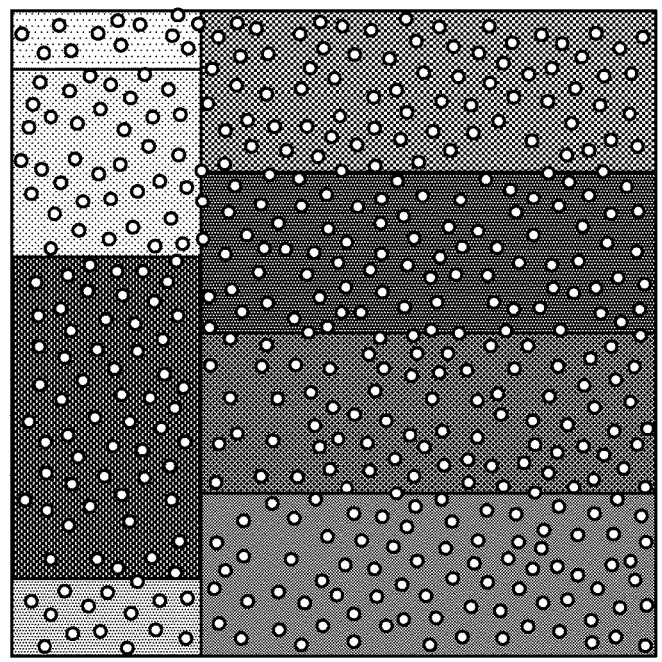
FIG. 3D is a field of view showing illumination of a set of physically dispersed selection of cells based on a CAD database, according to some embodiments.

FIG. 3D is a field of view 3D00 showing illumination of a set of physically dispersed selection of cells based on a CAD database. As shown, the illuminated cells represent cells of a certain type. The XY location of those cells are determined by reading a CAD database (e.g., GDSII data). Precision probe positioning can be used to take measurements at only those locations, and perform analysis of the readings from only those locations. In such a manner a failure mode hypothesis can be tested. For example a failure mode hypothesis might include the suspicion that a cell of a certain type violates a design rule, and thus is the root cause of a swarm of failures (also see FIG. 2C). In the example shown, the locations of instances of the cell of a certain type are dispersed almost uniformly throughout the field of view. The measurements and analysis of the readings from only those locations can be used in conjunction with a logical overlay, and examples of such logical overlays are discussed as follows.

Figure 3E:
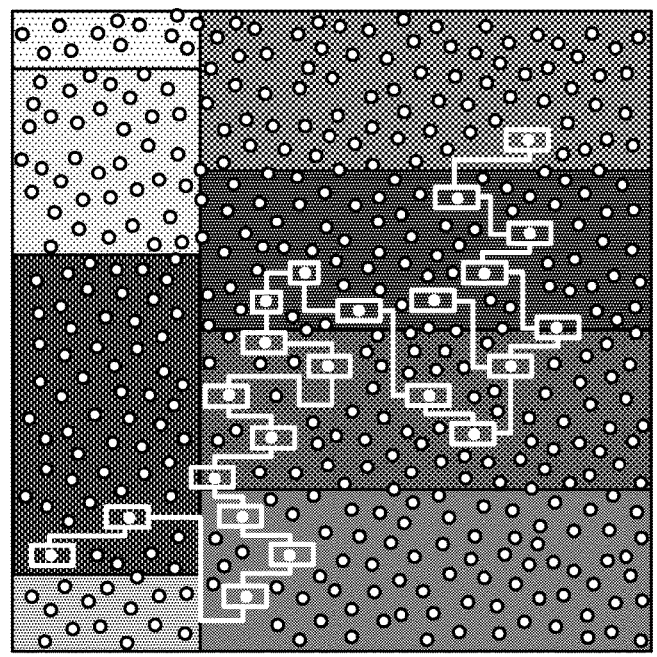
FIG. 3E is a field of view showing an overlay of sequential element boundaries over a set of illumination points determined based on a CAD database, according to some embodiments.

FIG. 3E is a field of view 3E00 showing an overlay of sequential element boundaries over a set of illumination points determined based on a CAD database. As shown, the dispersed instances of cells of a certain type are overlaid with graphical screen devices to highlight cell boundaries, and interconnections between the cells. The occurrences/instances of the cell of a certain type can be determined from a CAD database (e.g., from a schematic or from a netlist), and the XY location can be determined from a CAD database (e.g., from a layout planner or from GDSII data, or from a mask set). In some situations, the wafer used in the production of integrated circuits can exhibit non-linearity (e.g., from bowing effects at the edges of a wafer), and also, the reticles and/or other optical devices used in the production of integrated circuits can exhibit non-linearity. Such non-linearity can be recognized and/or compensated for when positioning the laser probe, and/or chuck and stage, and/or when using the photon detector. In some situations, layout data can sometimes be inaccurate and/or imprecise. One mitigation technique (e.g., overscan technique) is to define an AOI that covers an area somewhat larger than what is given in the layout data. Further, some embodiments provide a user interface so as to allow the user to specify the amount of overscan.

Figure 3F:
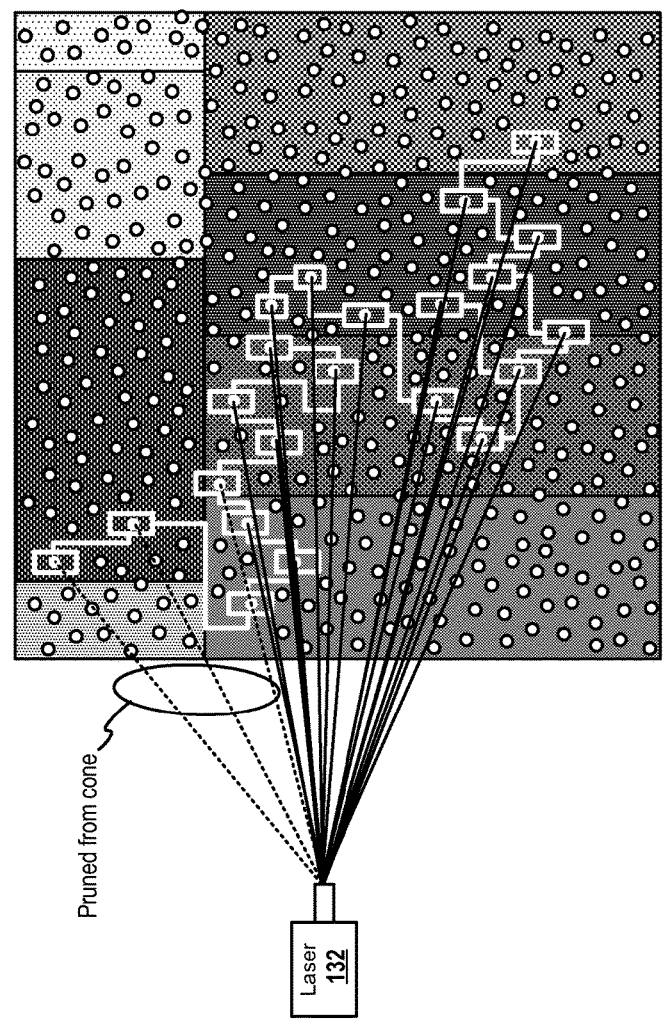
FIG. 3F is a field of view showing readings taken at sequential elements to implement a cone pruning failure cause isolation approach, according to some embodiments.

FIG. 3F is a field of view 3F00 showing readings taken at sequential elements to implement a cone pruning failure cause isolation approach. Various techniques can be employed to cross reference instances of sequential cells (or other electronic devices) found in scan chains or cones that correlate to a passing or failing empirical reading. Any known in the art technique can be used to extract a logic cone from a schematic or other interconnect database, and thus any sequential cells (or other electronic devices) found in the logic cone can be subjected to a succession of empirical measurements. The empirically measured logic values found at a point in a logic cone can be determined to be a value that could cause (for example) a measured stuck-at sequential device, or the empirically measured logic values found at a node in a logic cone can be determined to be a value that could not influence the measured stuck-at sequential device. In the latter case those readings serve to prune from consideration the behavior of the electronic devices upstream of the measured node. After pruning, those upstream electronic devices need not be re-scanned or further considered for determining a cause of failure.

FIG. 4A depicts user-defined patterns for reading multiple intra-cell sites having multiple charge carriers for analysis within systems that implement precision probe positioning.

As shown, FIG. 4A depicts user-defined patterns 4A00 for reading multiple intra-cell sites. In some cases a single cell might have multiple sites that accumulate charge at specific points within the cell. A system for precision probe positioning serves to take readings at precise locations, and such precise locations can be user-defined. For example, a geometrically rectangular cell might have a user-defined pattern in an 11 by 5 pattern (as shown in the small spot user illumination pattern 403). Or, in another embodiment, a geometrically rectangular cell might have a user-defined pattern in a 6 by 3 pattern (see larger spot user illumination pattern 411). The user-defined pattern can be prescribed to successively and uniformly illuminate points of interest within a cell (as shown), or it can be prescribed to illuminate specific locations within a cell. For example, a user-defined pattern might include illumination of a spot between two traces expected to hold the same logic value (e.g., see point 404 and point 408), or a user-defined pattern might include illumination of a spot within the boundary of an oscillator (e.g., see point 406).

In some embodiments, the size of the spot can be varied during the course of a series of readings. One way to vary the size of the spot that is incident on the integrated circuit is to change the Z distance (e.g., by moving a chuck and stage in the Z direction). Varying the Z distance can also serve to identify probe points that exhibit characteristics of a desired signal-to-noise ratio (SNR). Further, varying the Z direction can be used in cross talk analysis. Still further, precision pixel positioning supports not only area of interest, but also volume of interest probing (e.g., varying the z direction while within a specific XY defined area of interest). FIG. 4B depicts user-defined patterns for reading multiple intra-cell sites having multiple charge carriers for analysis within systems that implement precision probe positioning. A shown, FIG. 4B depicts intra-cell sites 4B00 having multiple charge carriers that change based on a known pattern for analysis within systems that implement precision probe positioning for at-speed integrated circuit testing using through silicon in-circuit logic analysis. As an option, the present intra-cell sites 4B00 may be implemented in the context of the architecture and functionality of the embodiments described herein. Also, the intra-cell sites 40B0 or any aspect therein may be implemented in any desired environment.

The user-defined array patterns of FIG. 4A and any corresponding techniques can be used in various embodiments. Additionally, a single cell might have particular sites that accumulate a charge at specific points or areas of interest within the cell. Accordingly a user-defined pattern can correspond to a particular cell type. In some cases multiple defined patterns can correspond to a single particular cell type.

As shown, a particular logic cell (possibly comprising many electronic devices) can become the subject of at-speed integrated circuit testing using through-silicon in-circuit logic analysis. Using an optical microscope, a cell or areas within a cell can be optically probed using user-defined spots (e.g., spot_1, spot_2, spot_3, and spot_4). In some cases the spot probe might overlap two or more nodes or electronics devices, and multiple readings (e.g., see spot_1, and spot_2) might be taken and averaged or otherwise combined in order to classify the reading or readings as a pass (P), or fail (F), or not present (NP), and to generate corresponding indications. In some cases, a spot (e.g., see spot_1, and spot_2) is substantially the same size as a subject electronic device or gate or node or area of interest. In other cases a spot might be larger than a subject electronic device or gate or node or area of interest. In still other cases a spot might be smaller than a subject electronic device or gate or node or area of interest. If fact, it is possible to get signals (e.g., by processing reflected light from incident laser) even when the transistor or active signal area of the transistor is much smaller than the spot size. In some cases, a spot might be larger than a subject electronic device or gate or node, and in some such cases, the reflected light from incident laser may be modulated by more than one device or gate or node. When the spot overlaps a device of interest with other cells, the reflection can be modulated by multiple cells, potentially introducing crosstalk in the reflected light. One technique to deal with detected crosstalk is to probe around the area of interest (e.g., in X and Y directions) and/or to probe around in the Z direction. This probing technique results in many waveforms which can then be analyzed. For example, such analysis can include filtering and/or other processing of the combined data, and solving a system of multiple equations to de-convolve the logic signals.

Strictly as examples, a spot might be characterized as having a 20 nm diameter, or a 40 nm diameter, or an 80 nm diameter, or a 240 nm diameter or a 260 nm diameter, or a 280 nm diameter, or a 300 nm diameter, or a 320 nm diameter, and can be still larger or smaller depending on the technique to be employed.

As depicted in the right portion of FIG. 4B, a user-defined pattern can be used in the course of scanning multiple areas of interest. Whenever a cell of a particular type is encountered (e.g., see the method of location discussion given for FIG. 3D) one or more of the cell type specific user-defined patterns can be employed. Use of this technique often results in a higher confidence of a reading as compared to user-defined patterns that do not consider the location of charge carriers within a cell.

Various cell type-specific user-defined patterns can be formed on the basis of a model (e.g., in conjunction with theoretical knowledge). Or, cell type-specific user-defined patterns can be formed on the basis of a series of empirical measurements to determine a sweet spot.

FIG. 5A is a sweet spot scatter plot 5A00 used to empirically identify a set of sweet spot hit locations as used in conjunction with precision probe positioning. As shown, a series of eight candidate intra-cell points are successively illuminated, and the illumination return is analyzed to determine the candidate intra-cell point having a highest margin. The spots can be moved around in the XY direction to produce overlapping readings (as shown) and/or the stage and chuck can be moved in the Z direction. As such, an area of interest can be probed (e.g., by steering the laser incidence). As well, a volume of interest can be probed (e.g., by steering the laser incidence and by also varying the Z direction).

FIG. 5B is a sweet spot hit plot 5B00 used to empirically identify selected sweet spot hit locations after feedback from a sensor as used in conjunction with precision probe positioning. As shown the illumination return having the highest margin is selected (see spot selected 502) and used in the intra-cell user-defined pattern for that cell type.

In some cases more than one spot is needed in order to reach a statistical confidence that the user-defined intra-cell pattern will result in an accurate reading over a range of test conditions.

FIG. 5C is a non-overlapping sweet spot scatter plot 5C00 used to empirically identify a set of sweet spot hit locations as used in conjunction with precision probe positioning. The juxtaposition of the overlapping spots as in FIG. 5A is merely an example. Other juxtapositions are reasonable and envisioned. One such juxtaposition is depicted in FIG. 5C. As shown, the juxtaposition does not have any overlapping spots. Still, the illumination return having the highest margin is selected and used in the intra-cell user-defined pattern for that cell type.

FIG. 6 shows highlighting imagery superimposed over a selected field of view 600 of a portion of an integrated circuit under test in a system for precision probe positioning for at-speed integrated circuit testing using through silicon in-circuit logic analysis. As an option, the present selected field of view 600 may be implemented in the context of the architecture and functionality of the embodiments described herein. Also, the selected field of view 600 or any aspect therein may be implemented in any desired environment.

FIG. 6 shows colored (or patterned) "dots" at locations where the logic comparator 150 has detected a pattern that matches the reference logic state or pattern 148. In this case, the reference logic pattern was detected at the location of the reference target. However, the reference logic pattern may also be provided by external test equipment, other software, or by the user. Strictly as an example, a user can input a known or suspected pattern, or a simulation run can be performed in order to provide the expected logic pattern.

In some cases the location of a reference target 602 might be proximally identical to the location where the reference pattern was observed. In other cases, some mis-registration might be present, and following the techniques as described herein, a location of a matched pattern 604 might be identified (e.g., using an optical microscope), and the imaging can be registered with precision. Such a location of a matched pattern 604 as identified can be considered to be merely a hypothesis, and additional readings might be taken to confirm and/or increase the statistical confidence that the location of a matched pattern 604 is indeed the reference target of interest.

In some cases the registration can be performed with extreme precision by taking optical measurements in a small area, thus producing an image to represent a high magnification of a very small field of view.

Steps to calibrate the optical microscope can be taken for registering the integrated circuit. Also, steps to calibrate the optical microscope can be taken for registering with respect to the entire FOV and/or an AOI. One technique involves importing the local diffusion layer within the FOV and locating a recognizable feature. The recognized feature is then scaled with respect to other layers of the image formed by the arrangement of samples (e.g., measured reflections) of the incident laser light. In some embodiments, pattern recognition techniques can be used to automate this scaling/calibration technique.

FIG. 7 shows a high magnification of a very small field of view 700 used during misalignment detection for analyzing an integrated circuit under test in a system for precision probe positioning for at-speed integrated circuit testing using through silicon in-circuit logic analysis. As an option, the present very small field of view 700 may be implemented in the context of the architecture and functionality of the embodiments described herein. Also, the very small field of view 700 or any aspect therein may be implemented in any desired environment.

As described above, the current probe position 704 is misaligned with respect to the actual XY location of a known target 702. Such a misalignment can be due to many factors, including offsets in the optical path and/or offsets in the mechanical stages used to position the laser beam. In some cases the laser beam is moved (e.g., re-calibrated) and an acquisition is re-attempted. Failure to acquire a signal might lead to repeated re-positioning/re-calibration of the laser beam. In many cases, a reference frequency representative of the target signal is present, allowing acquisition of that reference frequency with an analog spectrum analyzer. Acquiring a signal and testing for the reference frequency at all pixels in a field of view spatially identifies the target and the operator calibrates the laser beam to that location. Following the herein-disclosed techniques, systems and methods, the target location may be detected directly using the pixel-by-pixel precision probe positioner to detect a target logic pattern (e.g., instead of merely the reference frequency). The detected location is marked on the image with a superimposed symbol. Further, the above reference frequency at the target location may also be detected using fast Fourier transforms (FFTs) to locate the pixel with the strongest signal. In this case of locating the reference frequency with a FFT, the detected location is again marked on the image with a superimposed symbol and the operator calibrates the laser beam to that location. In still further embodiments, a search grid or user-defined pattern can direct the laser to automatically step a pattern and record the waveform. The saved observations can be automatically collated, and a user can then inspect the results to check for cross talk and/or look for locations showing a maximum signal amplitude.

The current probe position 704 is calibrated to match the correct probe position (e.g., see corrected location of probe target 706). A test pattern can be placed into a chuck, and thereby calibrate the XY addressability of the laser probe. In some situations, and augmenting the previous discussion of FIG. 1C, some implementations perform a 'global' three-point or N-point alignment within the FOV, and selects a target or targets to match to a layout. Such precision alignment/registration can be imaged (e.g., via graphical superimposition on display surfaces 129) to facilitate further precise optical inspection.

Figure 8A:
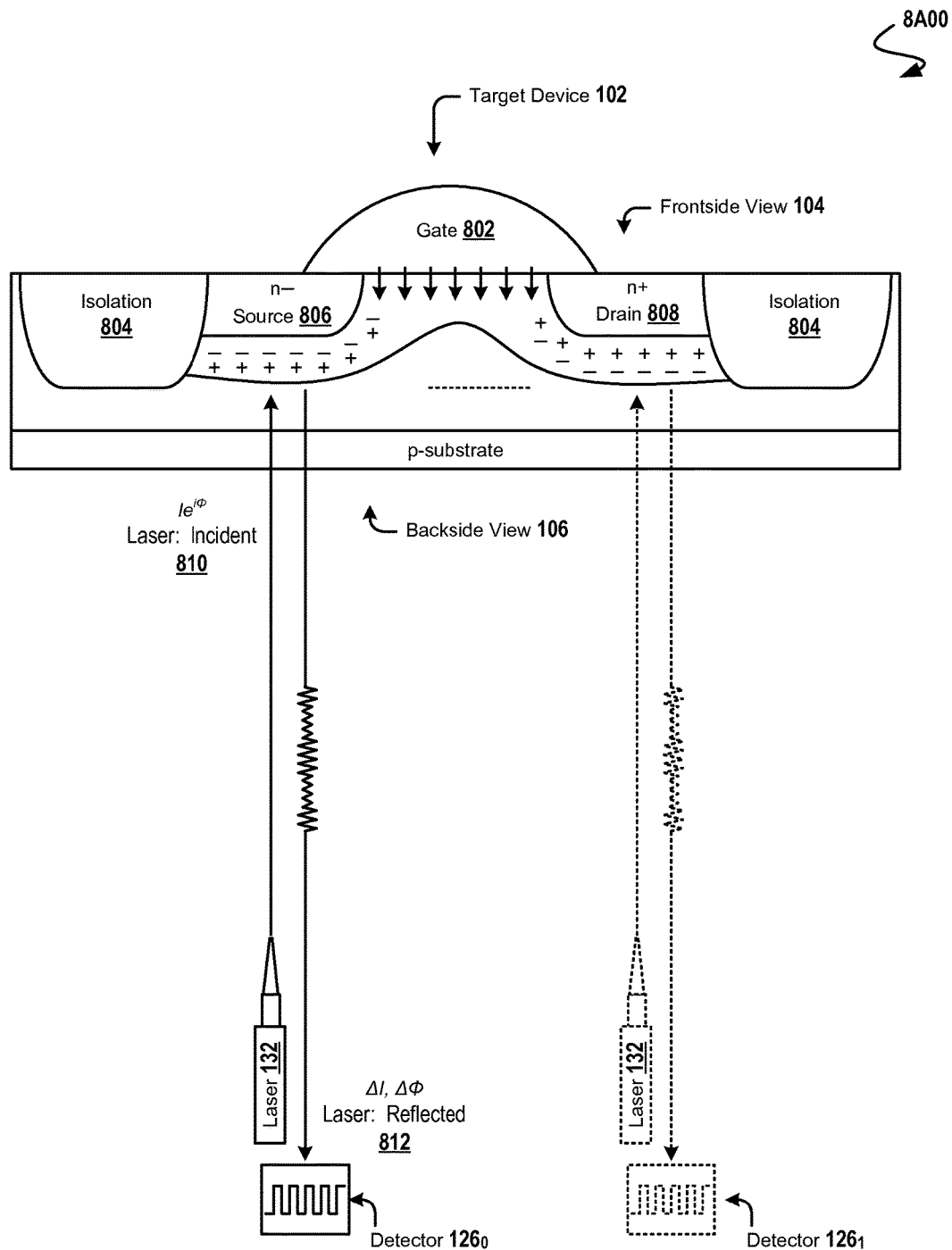
FIG. 8A is a schematic of a precision probe optical microscope as used in systems implementing precision probe positioning for at-speed integrated circuit testing using through silicon in-circuit logic analysis, according to some embodiments.

FIG. 8A is a schematic 8A00 of a precision probe positioned optical microscope as used in systems implementing precision probe positioning for at-speed integrated circuit testing using through silicon in-circuit logic analysis. As an option, the present schematic 8A00 may be implemented in the context of the architecture and functionality of the embodiments described herein. Also, the schematic 8A00 or any aspect therein may be implemented in any desired environment.

As shown, a target device 102 is affixed to a stage, and the stage can be moved in the X and Y directions within the XY plane. Or, a target device 102 is affixed to a stage, and the laser 132 and photon detector $126_0$ can be moved in the X and Y directions within the XY plane.

As depicted in the apparatus of FIG. 8A, free carriers modulated by the target device 102 serve to modify the absorption and index of refraction of the materials. As is well known in optics, this modifies the reflectivity and intensity of the return in the form of reflected light from incident laser 810. A change or modulation detected in reflected light 812, or a change in intensity, corresponds to the device behavior as the transistor switches on and off. A fast photon detector (e.g., photon detector $126_0$, photon detector $126_1$) is used to measure the return laser power signal over a time period. As shown, free carriers can accumulate in areas such as near or between a transistor source 806 and a gate 802, or between a transistor gate and a drain 808, or between an isolation barrier 804 and any other component of any other electronic structure or device.

Figure 8B:
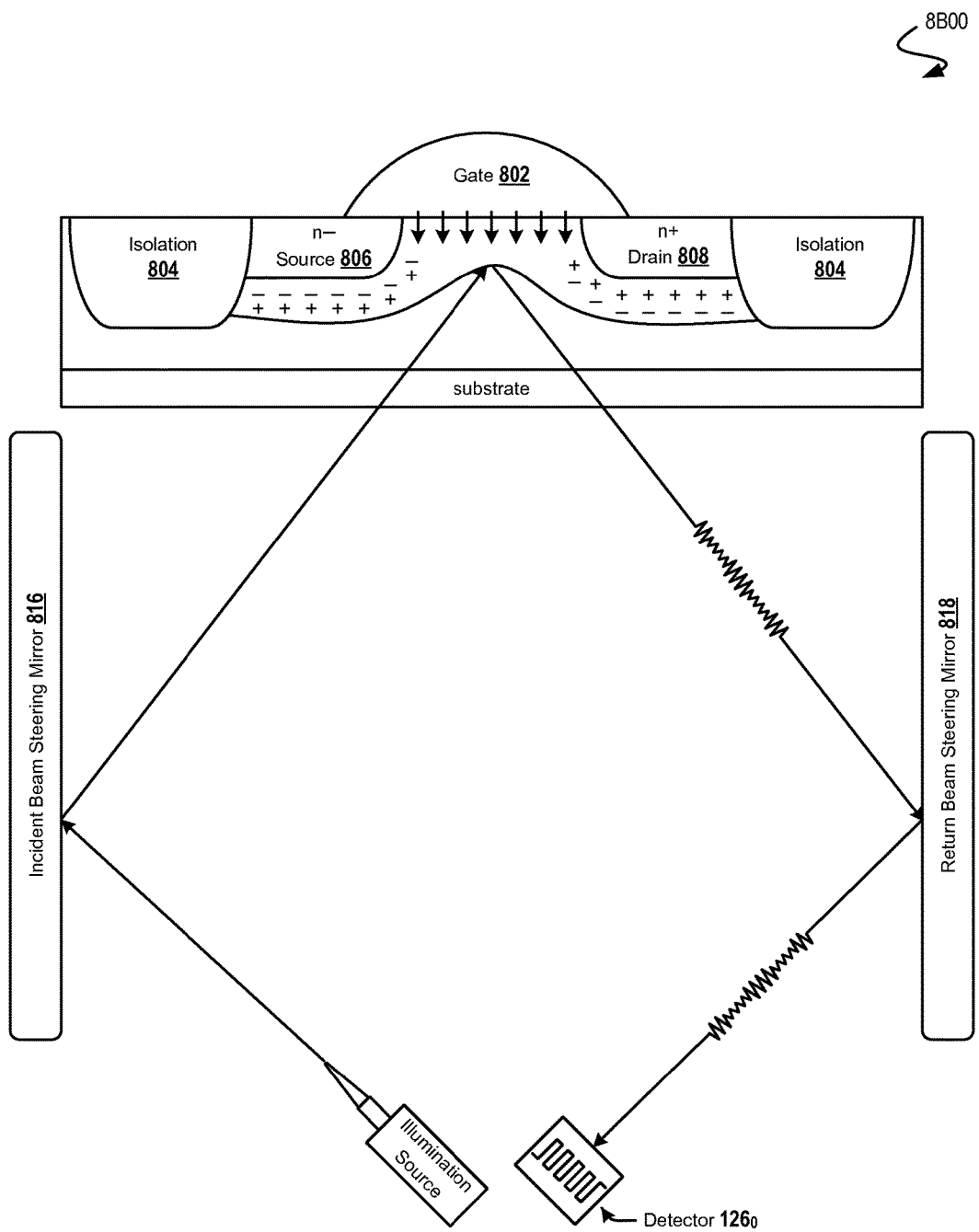
FIG. 8B is a schematic of a steered-beam precision probe optical microscope as used in systems implementing precision probe positioning for at-speed integrated circuit testing using through silicon in-circuit logic analysis, according to some embodiments.

FIG. 8B is a schematic 8B00 of a steered beam optical microscope 8B00 as used in systems implementing precision probe positioning for at-speed integrated circuit testing using through silicon in-circuit logic analysis. As an option, the present schematic 8B00 may be implemented in the context of the architecture and functionality of the embodiments described herein. Also, the schematic 8B00 or any aspect therein may be implemented in any desired environment.

The apparatus corresponding to schematic 8B00 comprises an illumination device, a photon detector, an incident beam steering mirror 816 and return beam mirror 818. The incident beam steering mirror 816 can be tipped/rotated so as to steer the incident laser beam to any location on the backside of the target device 102. Similarly, the return beam mirror 818 can be tipped/rotated so as to steer the return beam to the detector.

Figure 9:
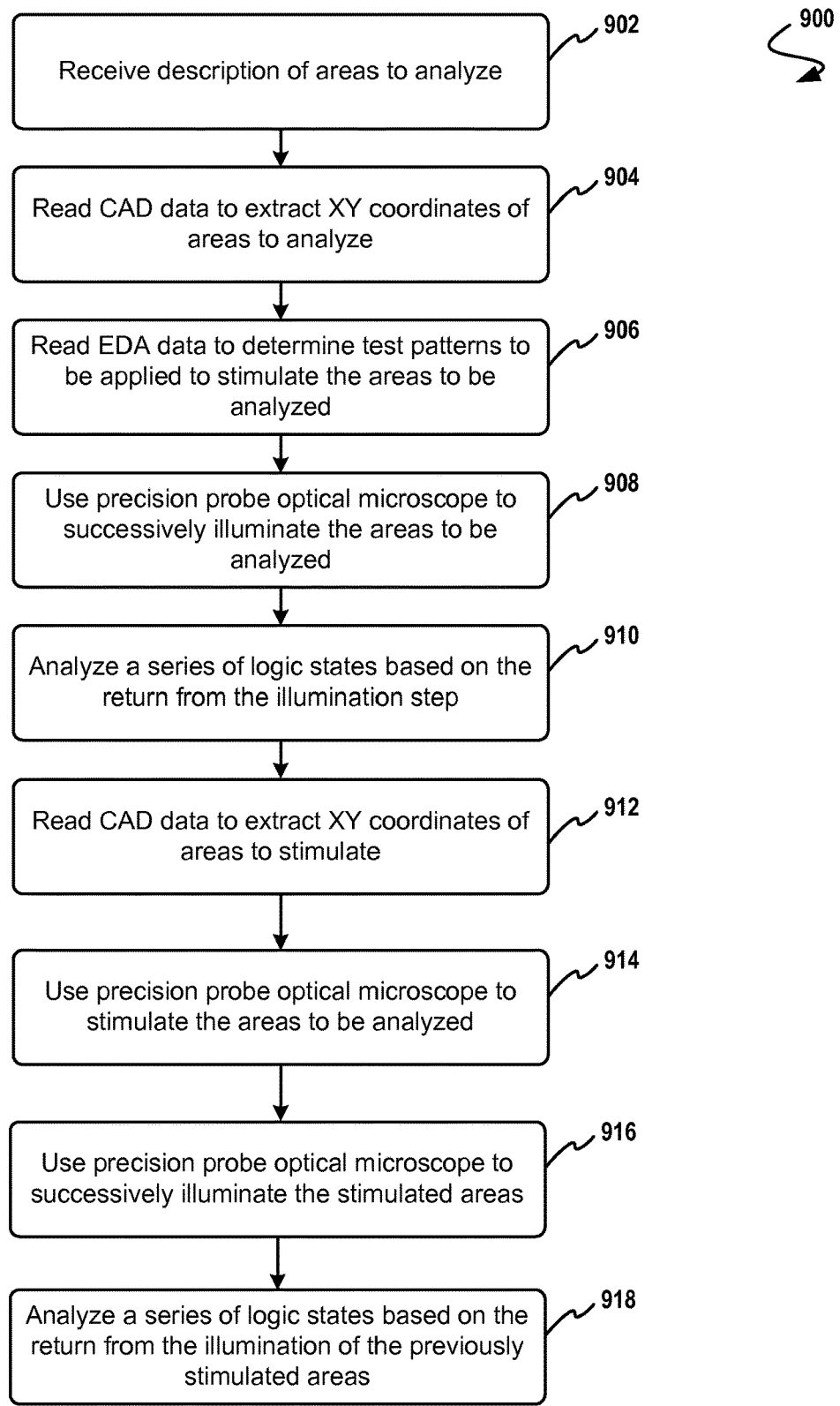
FIG. 9 is a schematic depicting a node isolation technique using a sequence of observations from a precision probe optical microscope as used in systems for precision probe positioning for at-speed integrated circuit testing using through silicon in-circuit logic analysis, according to some embodiments.

FIG. 9 is a schematic depicting a node isolation technique 900 using a sequence of observations from a precision probe positioned optical microscope as used in systems for precision probe positioning for at-speed integrated circuit testing using through silicon in-circuit logic analysis. As an option, the present node isolation technique 900 may be implemented in the context of the architecture and functionality of the embodiments described herein. Also, the node isolation technique 900 or any aspect therein may be implemented in any desired environment.

In this example, the failure description (see operation 902) shows a series of measurements (e.g., failure analysis measurements) pertaining to vias. Of interest is the location (and its corresponding electronic device) that is measured to be 'open'. A precision probe optical microscope might be used to take measurements at and/or around a group of candidate vias and report the readings. Accordingly, one or more of the candidate vias can be identified as being the source of the 'open (see operation 904)'. Still further analysis can be performed so as to unequivocally determine the existence of the open at the candidate position/device. For example, a simulation test vector known to produce a value at or near the candidate via can be applied to the device under test (see operation 906), and a precision probe optical microscope can be used to successively illuminate the areas to be analyzed further (see operation 908). Still further through-silicon in-circuit measurements may be taken (e.g., using the return from illumination) and analyzed (see operation 910).

The aforementioned simulation test vector is but one technique that can be used to stimulate a device within an integrated circuit under test. Another technique uses laser heating at or near an area of interest. In particular, some embodiments uses a 1.3 µm (near infrared) laser to locally heat a device. At near infrared wavelengths, unwanted photocurrents are not generated in the silicon. In addition, silicon is relatively transparent at 1.3 µm permitting analysis from either the front side or backside of the integrated circuit. Under thermal stimulation, the behavior of the heated device may differ from the behavior of an unheated device. Many types of defects exhibit at least some measurable sensitivity to heat. For instance, a device operating at a higher temperature may exhibit slower switching performance, and at still higher temperatures the device may exhibit still slower switching performance as metal resistance increases and transistor mobility decreases. After localized heating, the device and/or an area of interest in proximity to the heated device is precision pixel scanned by a precision probe positioned (PPP) optical microscope. In some embodiments, the pass/fail state of the heated device is monitored (e.g., using a tester) while the laser scans in an area around the device. When the pass/fail state changes, a contrast variation will be produced in the imagery (e.g., in highlighting imagery superimposed over a selected field of view).

The aforementioned localized heating and LADA techniques can be used to perturb device characteristics such that the propagation time of signals traversing the illuminated device(s) changes in a controlled and repeatable manner. Techniques for inducing such non-permanent alterations in device behavior include:

Using the laser as a localized heat source, or
Using the laser as a localized current source.

On-tester operation can proceed as follows: With the DUT operating at a marginal state, (e.g. operating close to the pass/fail boundary for a fixed temperature, voltage, and frequency setting), a laser perturbs the timing of a node located within a critical signal path such that the maximum operating frequency of the DUT changes by an observable amount. For example, using an IC tester platform, the change in upper frequency bound is observable at one or more observation test points (e.g., the IC tester can measure the device's response to the perturbation at the peripheral outputs of the DUT). Depending on factors such as the test set-up for the DUT (e.g., how close to design maximums are the tests/operations), and depending on the type of timing perturbations induced, (e.g., increase delay by heating or decrease delay by current injection), the perturbation can induce pass/fail transitions in circuit behavior (e.g., a pass-to-fail transition, or a fail-to-pass transition). Some embodiments implementing LADA use a continuous wave (CW) wavelength laser that is precisely positioned on a suspected node or area of interest (see operation 914). During each test cycle, the pass/fail state of the DUT is interrogated and a binary output trigger indicating the pass/fail state of the DUT is generated by the tester. This pass/fail trigger is then sampled by the data acquisition electronics of the LADA system, which internally synchronizes the trigger event to the laser spot position on the die. Correlations between changes in the pass/fail state of the DUT and the triggered laser spot XY location are determined, and correlated nodes (e.g., sensitive nodes) become candidates for further investigation techniques such as analysis of laser light reflection (see operation 918) after precise positioning of the beam on a single node (see step 916).

Figure 10:
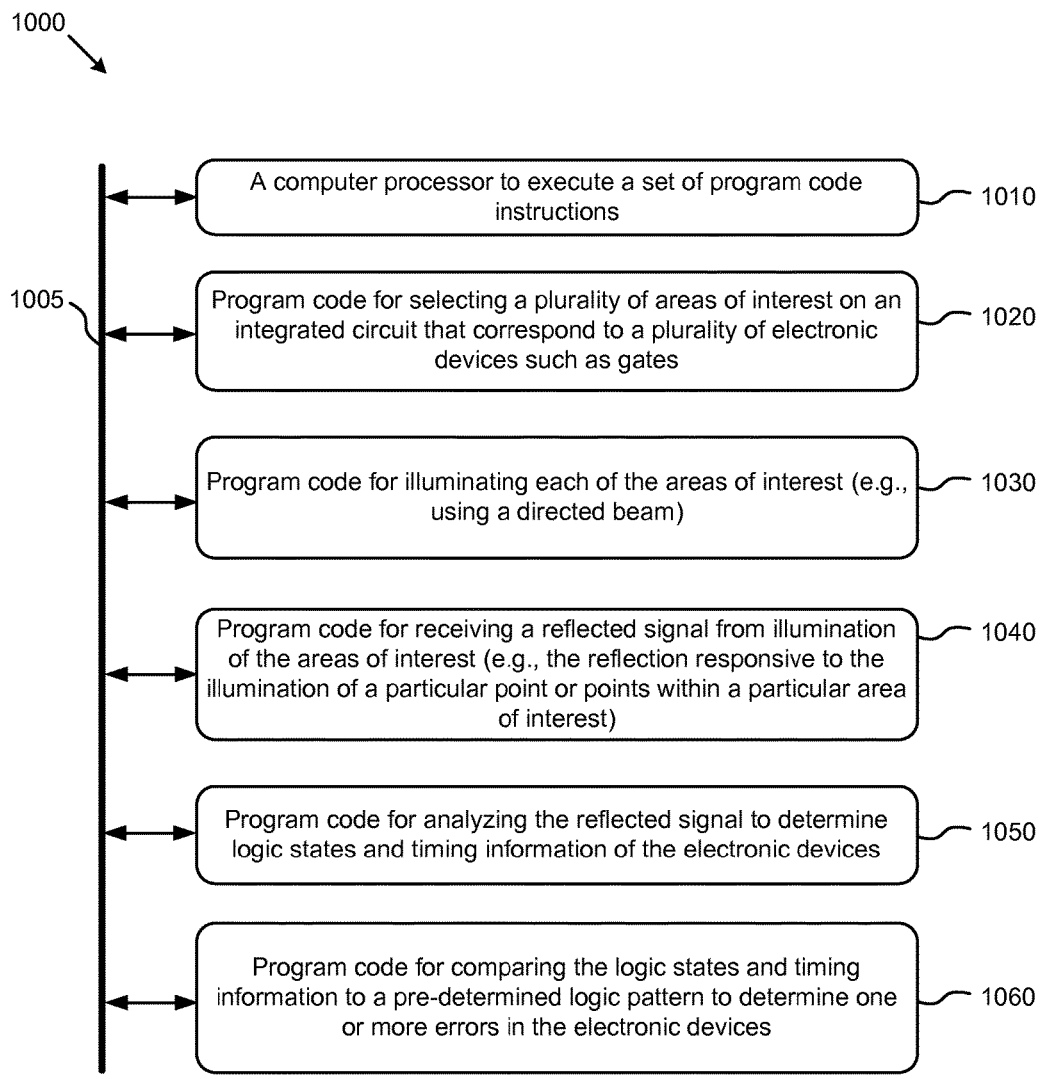
FIG. 10 is a flow chart of a technique for using CAD and EDA (Electronic Design Automation) data to determine candidate sites as used in systems for precision probe positioning for at-speed integrated circuit testing using through silicon in-circuit logic analysis, according to some embodiments.

FIG. 10 is a system for at-speed integrated circuit device observation and analysis of a selected set of sites. As an option, the present system 1000 may be implemented in the context of the architecture and functionality of the embodiments described herein. Of course, however, the system 1000 or any operation therein may be carried out in any desired environment.

As shown, system 1000 comprises at least one processor and at least one memory, the memory serving to store program instructions corresponding to the operations of the system. As shown, an operation can be implemented in whole or in part using program instructions accessible by a module. The modules are connected to a communication path 1005, and any operation can communicate with any other operations over communication path 1005. The modules of the system can, individually or in combination, perform method operations within system 1000. Any operations performed within system 1000 may be performed in any order unless as may be specified in the claims. The embodiment of FIG. 10 implements a portion of a computer system, shown as system 1000, comprising a computer processor to execute a set of program code instructions (see module 1010) and modules for accessing memory to hold program code instructions to perform: selecting a plurality of areas of interest on an integrated circuit that correspond to a plurality of electronic devices such as gates (see module 1020); illuminating (e.g., using a laser beam) each of the areas of interest (see module 1030); receiving a reflected signal from illumination of the areas of interest such as the reflection responsive to the illumination of a particular point or points within a particular area of interest (see module 1040); and analyzing the reflected signal to determine logic states and timing information of the electronic devices (see module 1050). Further, some embodiments include a processor for comparing the logic states and timing information to a pre-determined logic pattern to determine one or more errors in the electronic devices (see module 1060).

Figure 11:
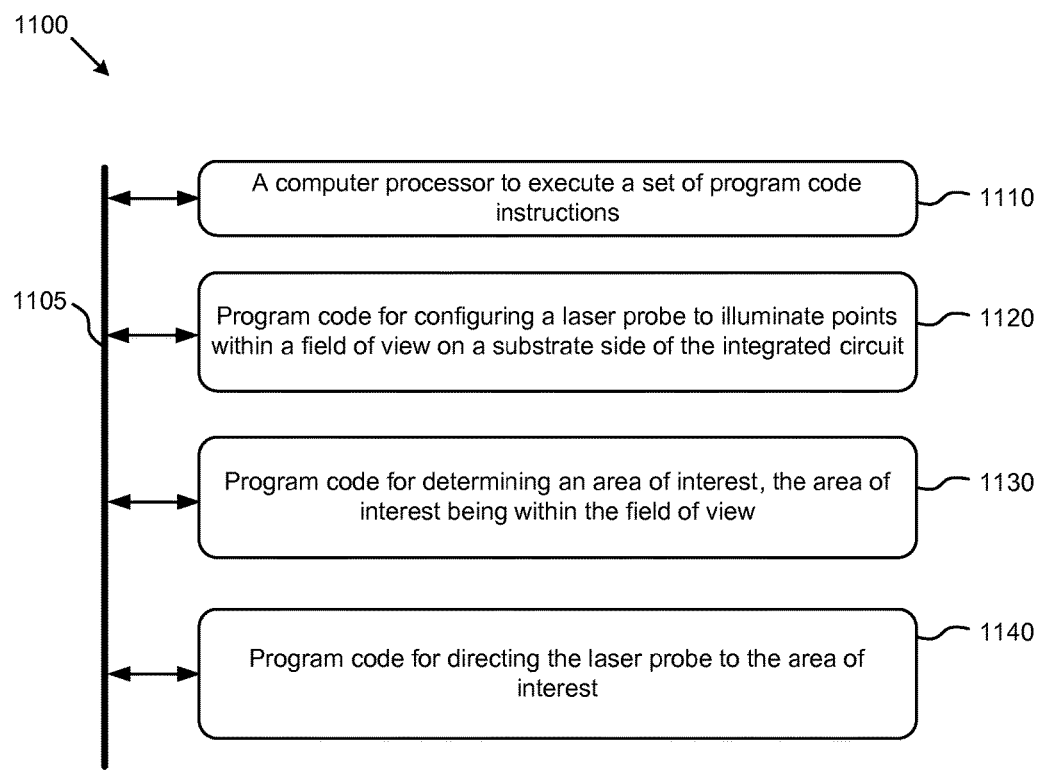
FIG. 11 is a block diagram of a computer system for implementing embodiments of this disclosure.

FIG. 11 is a system 1100 implementing a technique for using CAD and EDA (electronic design automation) data to determine candidate sites as used in systems for precision probe positioning for at-speed integrated circuit testing using through silicon in-circuit logic analysis. As an option, the present system 1100 may be implemented in the context of the architecture and functionality of the embodiments described herein. Of course, however, the system 1100 or any operation therein may be carried out in any desired environment.

As shown, system 1100 comprises at least one processor and at least one memory, the memory serving to store program instructions corresponding to the operations of the system. As shown, an operation can be implemented in whole or in part using program instructions accessible by a module. The modules are connected to a communication path 1105, and any operation can communicate with other operations over communication path 1105. The modules of the system can, individually or in combination, perform method operations within system 1100. Any operations performed within system 1100 may be performed in any order unless as may be specified in the claims. The embodiment of FIG. 11 implements a portion of a computer system, shown as system 1100, comprising a computer processor to execute a set of program code instructions (see module 1110) and modules for accessing memory to hold program code instructions to perform: configuring a laser probe to illuminate points within a field of view on a substrate side of the integrated circuit (see module 1120); determining an area of interest, the area of interest being within the field of view (see module 1130); and directing the laser probe to the area of interest (see module 1140).

Figure 12:
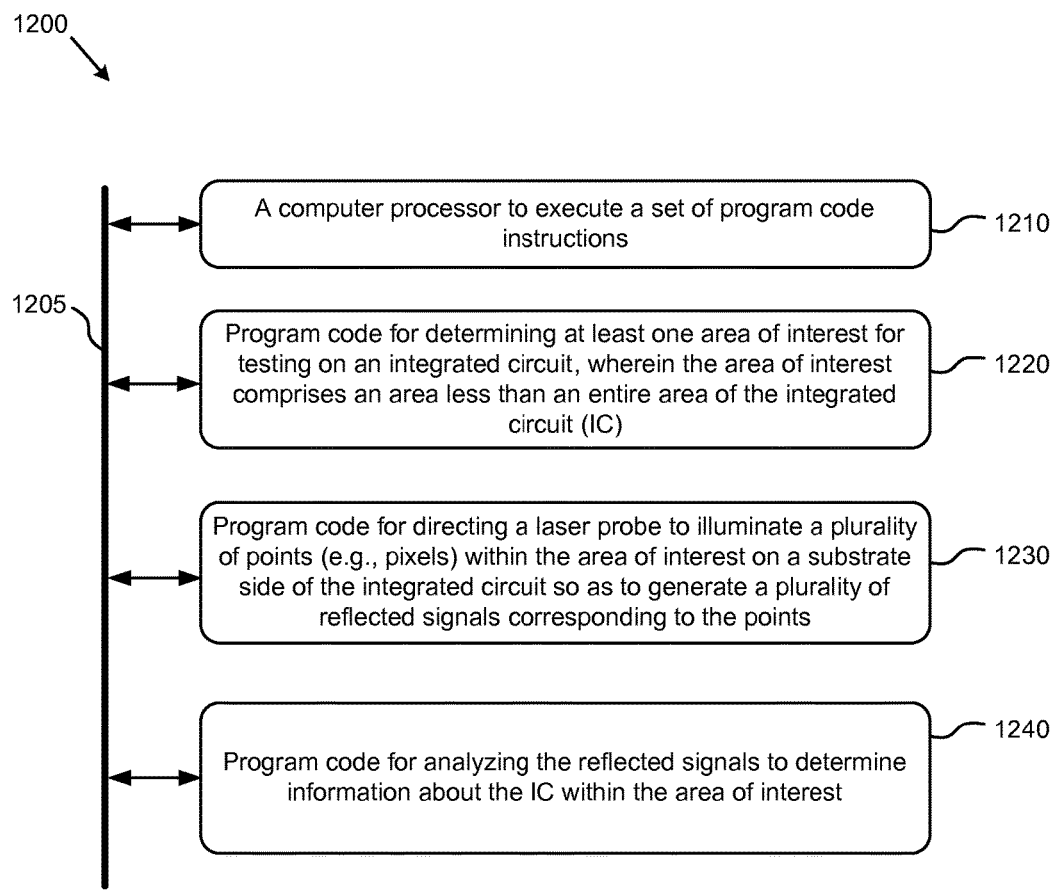
FIG. 12 is a block diagram of a computer system for implementing embodiments of this disclosure.

FIG. 12 is a block diagram 1200 of a computer system for implementing embodiments of this disclosure. The block diagram comprises computer processor to execute a set of program code instructions (see module 1210), a communication path 1205 and modules comprising: Program code (see module 1220) for determining at least one area of interest for testing on an integrated circuit, wherein the area of interest comprises an area less than an entire area of the integrated circuit (IC), program code (see module 1230) for directing a laser probe to illuminate a plurality of points (e.g., pixels) within the area of interest on a substrate side of the integrated circuit so as to generate a plurality of reflected signals corresponding to the points, and program code (see module 1240) for analyzing the reflected signals to determine information about the IC within the area of interest.

System Architecture Overview

FIG. 13 is a block diagram 1300 of a computer system for implementing embodiments of this disclosure. In one context, The computer system includes nodes for client computer systems (e.g., client system $1302_1$ through client system $1302_N$), nodes for server computer systems (e.g., server system $1304_1$ through server system $1304_N$), and nodes for network infrastructure (e.g., network infrastructure $1306_1$ through network infrastructure $1306_N$), any of which nodes may comprise a machine (e.g., computer 1350) within which a set of instructions for causing the machine to perform any one of the techniques discussed above may be executed. The embodiment shown is purely exemplary, and might be implemented in the context of one or more of the figures herein.

Any node of the network may comprise a general-purpose processor, a digital signal processor (DSP), an application specific integrated circuit (ASIC), a field programmable gate array (FPGA) or other programmable logic device, a discrete gate or transistor logic, discrete hardware components, or any combination thereof capable to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration, etc.).

In alternative embodiments, a node may comprise a machine in the form of a virtual machine (VM), a virtual server, a virtual client, a virtual desktop, a virtual volume, a network router, a network switch, a network bridge, a personal digital assistant (PDA), a cellular telephone, a web appliance, or any machine capable of executing a sequence of instructions that specify actions to be taken by that machine. Any node of the network may communicate cooperatively with another node on the network. In some embodiments, any node of the network may communicate cooperatively with every other node of the network. Further, any node or group of nodes on the network may comprise one or more computer systems (e.g., a client computer system, a server computer system) and/or may comprise one or more embedded computer systems (including a processor and memory), a massively parallel computer system, and/or a cloud computer system.

The computer system (e.g., computer 1350) includes a processor 1308 (e.g., a processor core, a microprocessor, a computing device, etc.), a computer memory (e.g., main memory 1310), and/or a static memory 1312, which communicate with each other via a system bus 1314. The computer 1350 may further include a display unit (e.g., computer display 1316) that may comprise a touch screen, or a liquid crystal display (LCD), or a light emitting diode (LED) display, or a cathode ray tube (CRT). As shown, the computer system also includes a human input/output (I/O) device 1318 (e.g., a keyboard, an alphanumeric keypad, etc.), a pointing device 1320 (e.g., a mouse, a touch screen, etc.), a drive unit 1322 (e.g., a disk drive unit, a CD/DVD drive, a tangible computer readable removable media drive, an SSD storage device, etc.), a signal generation device 1328 (e.g., a speaker, an audio output, etc.), and a network interface device 1330 (e.g., an Ethernet interface, a wired network interface, a wireless network interface, a propagated signal interface, etc.).

The drive unit 1322 includes a machine-readable medium 1324 on which is stored a set of instructions (e.g., software, firmware, middleware, etc.) 1326 embodying any one, or all, of the methodologies described above. The set of instructions 1326 is also shown to reside, completely or at least partially, within the main memory and/or within the processor 1308. The set of instructions 1326 may further be transmitted or received via the network interface device 1330 over the system bus 1314.

It is to be understood that embodiments of this disclosure may be used as, or to support, a set of instructions executed upon some form of processing core (such as the CPU of a computer) or otherwise implemented or realized upon or within a machine- or computer-readable medium. A machine-readable medium includes any mechanism for storing non-transitory information in a form readable by a machine (e.g., a computer). For example, a machine-readable medium includes read-only memory (ROM); random access memory (RAM); magnetic disk storage media; optical storage media; flash memory devices; and electrical, optical or acoustical or any other type of media suitable for storing non-transitory information.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than restrictive sense.

What is claimed is:

1. A system, comprising:
a module to determine at least one area of interest for testing on an integrated circuit (IC), wherein the area of interest comprises an area less than an entire area of the IC;
a probe positioner to direct a laser probe to illuminate a plurality of pixels within the area of interest on a substrate side of the IC so as to generate a plurality of reflected signals corresponding to the pixels;
a photon detector to measure the reflected signals to determine information about a logic chain within the area of interest, the logic chain including upstream logic and downstream logic, and the upstream logic providing electrical input to the downstream logic; and
a processor, the processor being adapted to execute a set of program code instructions, which when executed cause the processor to:
determine a failure condition of the upstream logic; and
if a failure condition is determined for the downstream logic, confirm the failure condition of the upstream logic, otherwise, if the downstream logic is determined to be operating properly, classify the failure condition of the upstream logic as a false failure.

2. The system of claim 1, further comprising a scan mirror for positioning the laser probe to illuminate XY addressable pixel locations within the area of interest on the IC.

3. The system of claim 1, wherein determining at least one area of interest for testing on the IC comprises receiving user-defined XY addressable pixel locations within the area of interest.

4. The system of claim 1, wherein:
the module to determine at least one area of interest receives input from an IC database that defines logic cell areas within the area of interest; and
the probe positioner to direct the laser probe directs the laser probe to illuminate one or more XY addressable pixel locations within the logic cell areas.

5. A computer program product embodied in a non-transitory computer readable medium, the computer readable medium having stored thereon a sequence of instructions which, when executed by a processor, causes the processor to execute a method, the method comprising:
determining at least one area of interest for testing on an integrated circuit (IC), wherein the area of interest comprises an area less than an entire area of the IC;
directing a laser probe to illuminate a plurality of pixels within the area of interest on a substrate side of the IC so as to generate a plurality of reflected signals corresponding to the pixels;
measuring the reflected signals to determine information about a logic chain within the area of interest, the logic chain including upstream logic and downstream logic, and the upstream logic providing electrical input to the downstream logic; and
determining a failure condition of the upstream logic; and
if a failure condition is determined for the downstream logic, confirming the failure condition of the upstream logic, otherwise, if the downstream logic is determined to be operating properly, classifying the failure condition of the upstream logic as a false failure.

6. The computer program product of claim 5, further comprising a sequence of instructions for positioning the laser probe to illuminate XY addressable pixel locations within the area of interest on the IC.

7. The computer program product of claim 5, wherein determining at least one area of interest for testing on the IC comprises receiving user-defined XY addressable pixel locations within the area of interest.

8. The computer program product of claim 5, wherein determining at least one area of interest comprises receiving input from an IC database that defines logic cell areas within the area of interest, and directing the laser probe further comprises directing the laser probe to illuminate one or more XY addressable pixel locations within the logic cell areas.

9. The computer program product of claim 5, wherein:
determining at least one area of interest comprises receiving layout information of the IC; and
directing the laser probe further comprises directing the laser probe to illuminate one or more XY addressable pixel locations based on the layout information.

10. The computer program product of claim 5, wherein determining at least one area of interest for testing on the IC comprises receiving a user defined search pattern of pixels within the area of interest.

11. The computer program product of claim 5, wherein determining at least one area of interest for testing on the IC comprises identifying a pseudo-random pattern within the area of interest so as to eliminate tail artifacts.

12. The computer program product of claim 5, wherein:
determining at least one area of interest comprises identifying at least one logic cell; and
measuring the reflected signals further comprises analyzing the reflected signals for logic extraction within the logic cell.

13. The computer program product of claim 5, wherein measuring the reflected signals comprises analyzing the reflected signals to perform frequency mapping of the IC within the area of interest.

14. The computer program product of claim 5, wherein:
directing the laser probe comprises directing the laser probe to illuminate the pixels in a criss-cross pattern; and
measuring the reflected signals further comprises analyzing the reflected signals to identify a waveform signal.

15. The computer program product of claim 5, further comprising a sequence of instructions for using the laser probe as a localized heat source.

16. The computer program product of claim 5, further comprising a sequence of instructions for using the laser probe as a localized current source.

* * * * *